United States Patent
Kim et al.

(10) Patent No.: US 12,041,836 B2
(45) Date of Patent: Jul. 16, 2024

(54) DISPLAY DEVICE INCLUDING A SURFACE REINFORCING LAYER FORMED BY SURFACE TREATMENT OF AN ORGANIC INSULATING LAYER AND METHOD FOR MANUFACTURING THE SAME

(71) Applicant: SAMSUNG DISPLAY CO., LTD., Yongin-si (KR)

(72) Inventors: Jae Hyun Kim, Yongin-si (KR); Shogo Nishizaki, Yongin-si (KR); Byung Rok Moon, Yongin-si (KR); Young Seo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/501,134

(22) Filed: Oct. 14, 2021

(65) Prior Publication Data

US 2022/0246685 A1     Aug. 4, 2022

(30) Foreign Application Priority Data

Feb. 3, 2021 (KR) .................... 10-2021-0015726

(51) Int. Cl.
*H10K 59/40*     (2023.01)
*G06F 3/044*     (2006.01)
*H10K 50/844*    (2023.01)
*H10K 71/00*     (2023.01)

(52) U.S. Cl.
CPC .......... *H10K 59/40* (2023.02); *G06F 3/0446* (2019.05); *H10K 50/844* (2023.02); *H10K 71/00* (2023.02)

(58) Field of Classification Search
None
See application file for complete search history.

(56) References Cited

U.S. PATENT DOCUMENTS

| 9,293,731 | B2 | 3/2016 | Kim et al. |
| 9,941,485 | B2 | 4/2018 | Lee et al. |
| 10,168,844 | B2 | 1/2019 | Kwon et al. |
| 11,005,068 | B1 * | 5/2021 | Ye ............... H01L 51/56 |

(Continued)

FOREIGN PATENT DOCUMENTS

| CN | 111352531 A * | 6/2020 |
| KR | 10-2008-0017965 | 2/2008 |

(Continued)

*Primary Examiner* — Kirk W Hermann
(74) *Attorney, Agent, or Firm* — F. Chau & Associates, LLC

(57) ABSTRACT

A device includes: a display element layer disposed on a substrate, the display element layer including pixels; an encapsulation layer covering the display element layer; and a touch sensor disposed on the encapsulation layer. The touch sensor includes a first inorganic insulating layer disposed on the encapsulation layer; a first surface reinforcing layer formed by performing surface treatment on the first inorganic insulating layer and disposed on the first inorganic insulating layer; a first conductive layer disposed on the first surface reinforcing layer; a first organic insulating layer covering the first conductive layer; and a second conductive layer disposed on the first organic insulating layer and connected to the first conductive layer while penetrating the first organic insulating layer.

20 Claims, 20 Drawing Sheets

(56) References Cited

U.S. PATENT DOCUMENTS

| | | | | |
|---|---|---|---|---|
| 2003/0235994 | A1* | 12/2003 | Pan | H01L 21/31138 |
| | | | | 257/E21.252 |
| 2008/0050852 | A1 | 2/2008 | Hwang et al. | |
| 2011/0031501 | A1* | 2/2011 | Suzawa | H01L 51/56 |
| | | | | 257/E33.053 |
| 2013/0059155 | A1 | 3/2013 | Choi et al. | |
| 2014/0183462 | A1* | 7/2014 | Lee | H10K 50/844 |
| | | | | 257/40 |
| 2016/0079395 | A1* | 3/2016 | Sim | H01L 29/7848 |
| | | | | 438/283 |
| 2016/0209955 | A1* | 7/2016 | Kim | G06F 3/0445 |
| 2016/0378224 | A1* | 12/2016 | Kwon | H10K 59/40 |
| | | | | 345/174 |
| 2017/0075492 | A1 | 3/2017 | Kim et al. | |
| 2017/0186999 | A1* | 6/2017 | Lee | H10K 59/40 |
| 2018/0166519 | A1* | 6/2018 | Kim | H10K 59/122 |
| 2019/0265531 | A1* | 8/2019 | Hara | G06F 3/0445 |
| 2020/0235330 | A1* | 7/2020 | Chen | H01L 27/13 |

FOREIGN PATENT DOCUMENTS

| | | | |
|---|---|---|---|
| KR | 10-2015-0053530 | | 6/2015 |
| KR | 10-2017-0032953 | | 3/2017 |
| KR | 10-2017-0075876 | | 7/2017 |
| KR | 10-2017-0077942 | | 7/2017 |
| KR | 20190097487 A | * | 8/2019 |
| KR | 20220091214 A | * | 6/2022 |

* cited by examiner

DISPLAY DEVICE INCLUDING A SURFACE REINFORCING LAYER FORMED BY SURFACE TREATMENT OF AN ORGANIC INSULATING LAYER AND METHOD FOR MANUFACTURING THE SAME

CROSS-REFERENCE TO RELATED APPLICATION

The present application claims priority under 35 U.S.C. § 119 to Korean patent application 10-2021-0015726, filed on Feb. 3, 2021 in the Korean Intellectual Property Office, the entire disclosure of which is incorporated by reference herein.

TECHNICAL FIELD

The present disclosure generally relates to a display device, and more particularly, to a display device including a touch sensor.

DISCUSSION OF THE RELATED ART

Display devices are used to provide information to a user by displaying images, video, user interfaces, and the like. Some display devices may include means for user input in addition to display functionality. For example, the display devices may include a touch sensor.

The touch sensor may be attached to the display side of a display panel, or may be integrally formed with the display panel. A user may input information by pressing or touching the touch sensor.

The touch sensor may be applied not only to a flat panel display but also to a flexible display device, a curved display device, a foldable display device and a bendable display device, and others. Recently, there has been research into increasing bending characteristics of display devices and touch sensors, so as to be resistant to temperature change, physical stress, and moisture and particulates from the outside of the device.

SUMMARY

Embodiments provide a display device having a touch sensor including an inorganic material infiltration layer formed on a hydrogen-plasma-treated surface of an inorganic insulating layer and/or an organic insulating layer.

Embodiments also provide a method for manufacturing the same display device.

A display device in accordance with aspects of the present disclosure may include: a display element layer disposed on a substrate, the display element layer including pixels; an encapsulation layer covering the display element layer; and a touch sensor disposed on the encapsulation layer, wherein the touch sensor includes: a first inorganic insulating layer disposed on the encapsulation layer; a first surface reinforcing layer formed by performing surface treatment on the first inorganic insulating layer disposed on the first inorganic insulating layer; a first conductive layer disposed on the first surface reinforcing layer; a first organic insulating layer covering the first conductive layer; and a second conductive layer disposed on the first organic insulating layer, the second conductive layer being connected to the first conductive layer and penetrating the first organic insulating layer.

The first surface reinforcing layer may have a thickness of 10 Å to 500 Å.

The first surface reinforcing layer may obtained by performing hydrogen plasma treatment on a surface of the first inorganic insulating layer. The first surface reinforcing layer may have a film density greater than that of the first inorganic insulating layer.

The touch sensor may further include a second inorganic insulating layer disposed between the first surface reinforcing layer and the first conductive layer.

The touch sensor may further include: a second surface reinforcing layer disposed on the second inorganic insulating layer, where the second surface reinforcing layer is formed by performing hydrogen plasma treatment on a surface of the second inorganic insulating layer; and a third inorganic insulating layer provided between the second surface reinforcing layer and the first conductive layer.

The touch sensor may further include: a first inorganic material infiltration layer disposed on a surface of the first organic insulating layer, the first inorganic material infiltration layer including an organic material from the surface of the first organic insulating layer and further including an inorganic material infiltrated into a free volume near the surface of the first organic insulating layer; and a second organic insulating layer disposed on the first inorganic material infiltration layer to cover the second conductive layer.

The touch sensor may further include a second inorganic material infiltration layer disposed on a surface of the second organic insulating layer, the second inorganic material infiltration layer including an organic material from the surface of the second organic insulating layer and an inorganic material infiltrated into a free volume near the surface of the second organic insulating layer. Film densities of the first inorganic material infiltration layer and the second inorganic material infiltration layer may be greater than those of the first organic insulating layer and the second organic insulating layer.

The inorganic material may one or more of aluminum oxide, hafnium oxide, titanium oxide, zirconium oxide, tantalum oxide, silicon oxide, silicon nitride, and silicon oxynitride.

The touch sensor may further include: a second organic insulating layer disposed on the first organic insulating layer to cover the second conductive layer; and an inorganic material infiltration layer disposed on a surface of the second organic insulating layer, the inorganic material infiltration layer including an organic material from the surface of the second organic insulating layer and an inorganic material infiltrated into a free volume near the surface of the second organic insulating layer.

The encapsulation layer may include: at least one encapsulation organic layer; and encapsulation inorganic layers respectively provided on a top surface and a bottom surface of the at least one encapsulation organic layer.

A method of manufacturing a display device in accordance with aspects of the present disclosure may include: depositing a first inorganic insulating layer on an encapsulation layer covering a display element layer; forming a first surface reinforcing layer by performing surface treatment on the first inorganic insulating layer, forming a first conductive layer on the first surface reinforcing layer; forming, on the first surface reinforcing layer, a first organic insulating layer including a contact hole exposing a portion of the first conductive layer; and forming, on the first organic insulating layer, a second conductive layer connected to the first conductive layer through the contact hole.

In the forming of the first surface reinforcing layer, hydrogen plasma treatment may be performed on a surface of the first inorganic insulating layer for a predetermined time.

The forming of the first surface reinforcing layer further may include depositing a second inorganic insulating layer on the first surface reinforcing layer.

The forming of the first surface reinforcing layer may further include forming a second surface reinforcing layer by performing hydrogen plasma treatment on a surface of the second inorganic insulating layer.

The forming of the first organic insulating layer may include: depositing the first organic insulating layer on the first surface reinforcing layer; forming a first inorganic material infiltration layer by infiltrating an inorganic material into a free volume near a surface of the first organic insulating layer through an atomic layer deposition process; and forming the contact hole by etching the first organic insulating layer and the first inorganic material infiltration layer.

The forming of the first inorganic material infiltration layer may include: infiltrating a source gas into the first organic insulating layer by injecting the source gas onto the first organic insulating layer; injecting a purge gas to remove a portion of the remaining source gas; forming the first inorganic material infiltration layer including the inorganic material through a reaction of the source gas and a reaction gas by injecting the reaction gas including oxygen radical onto the first organic insulating layer; and injecting the purge gas to remove the remaining source gas and the reaction gas.

The inorganic material may include one or more of aluminum oxide, hafnium oxide, titanium oxide, zirconium oxide, tantalum oxide, and silicon oxide.

The method may further include: forming a second organic insulating layer covering the second conductive layer on the first inorganic material infiltration layer; and forming a second inorganic material infiltration layer by infiltrating an inorganic material into a free volume near a surface of the second organic insulating layer through the atomic layer deposition process.

Film densities of the first inorganic material infiltration layer and the second inorganic material infiltration layer may be greater than those of the first organic insulating layer and the second organic insulating layer.

A display device in accordance with aspects of the present disclosure may include: a display element layer provided on a substrate, the display element layer including pixels; an encapsulation layer covering the display element layer; a touch sensor provided on the encapsulation layer; and a window provided on the touch sensor, wherein the touch sensor includes: an inorganic insulating layer provided on the encapsulation layer; a first conductive layer provided on the inorganic insulating layer; a first organic insulating layer covering the first conductive layer; an inorganic material infiltration layer provided on a surface of the first organic insulating layer, the inorganic material infiltration layer including an organic material from the surface of the first organic insulating layer and further including an inorganic material infiltrated into a free volume near the surface of the first organic insulating layer; a second conductive layer provided on the inorganic material infiltration layer, the second conductive layer being connected to the first conductive layer while penetrating the first organic insulating layer and the inorganic material infiltration layer; and a second organic insulating layer provided on the inorganic material infiltration layer to cover the second conductive layer, wherein the inorganic material infiltration layer has a film density greater than that of the first organic insulating layer.

In the display device and the method for manufacturing the same in accordance with the present disclosure, a surface reinforcing layer and/or an inorganic material infiltration layer are/is included in an insulating layer of the touch sensor. Thus, the surface reinforcing layer and/or the inorganic material infiltration layer may block passage of gas (bubbles) transferred from inorganic layers thereunder, and have increased resilience against temperature change, moisture permeability, oxidation, etc. Accordingly, a snowflake bubble defect of the display device and the touch sensor may be removed, bending capability can be increased, and surface encapsulation characteristics can be reinforced.

BRIEF DESCRIPTION OF THE DRAWINGS

Example embodiments will now be described more fully hereinafter with reference to the accompanying drawings; however, they may be embodied in different forms and should not necessarily be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals may refer to like elements throughout the specification and the figures.

DETAILED DESCRIPTION OF THE EMBODIMENTS

Figure 1:
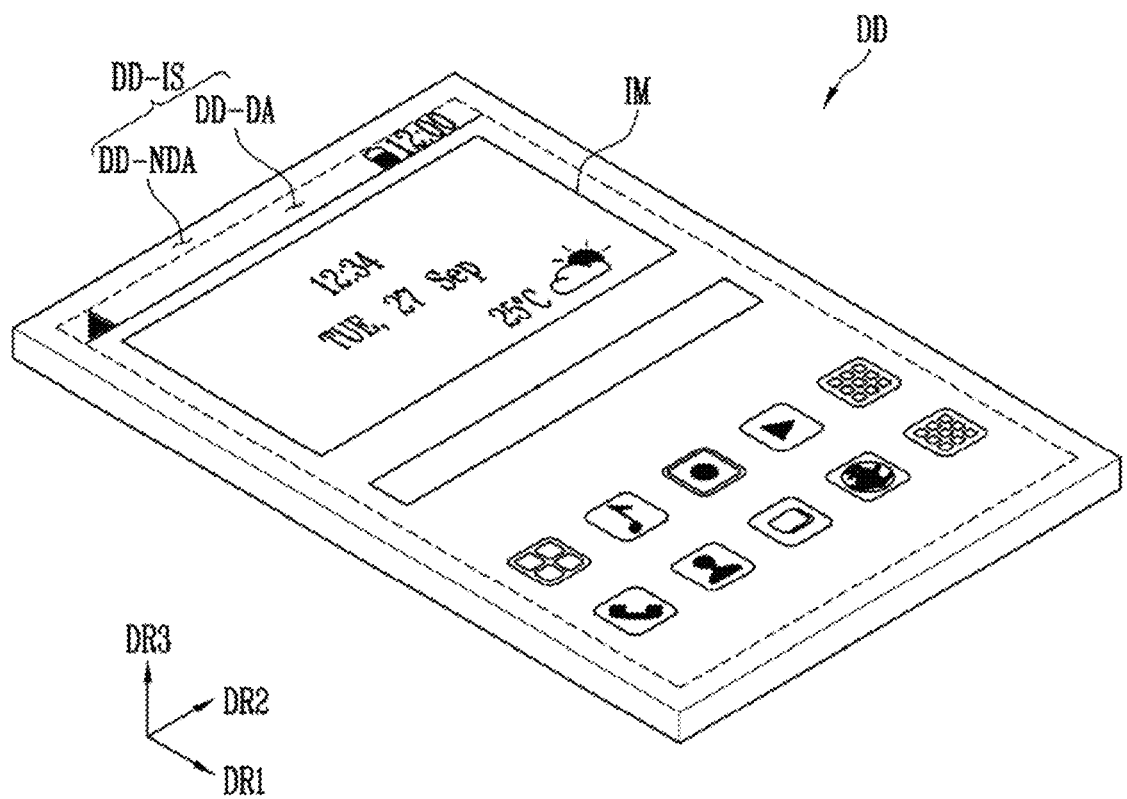
FIG. 1 is a perspective view illustrating a display device in accordance with embodiments of the present disclosure.

Hereinafter, embodiments of the present disclosure will be described in more detail with reference to the accompanying drawings. Throughout the drawings, the same reference numerals may refer to the same elements, and to the extent that a detailed description of a particular element has been omitted, that element may be at least similar to corresponding elements that have been described elsewhere in the specification.

As used herein, when a component is described as having "flexibility", the component may be configured to be bent, folded, rolled, or the like without damage to the component.

FIG. 1 is a perspective view illustrating a display device in accordance with embodiments of the present disclosure.

Referring to FIG. 1, the display device DD may display an image IM through a display surface DD-IS. The display surface DD-IS may be parallel to a surface defined by a first direction DR1 and a second direction DR2. A normal direction of the display surface DD-IS, e.g., a thickness direction of the display device DD with respect to the display surface DD-IS may be referred to as a third direction DR3.

A front surface (or top surface) and a back surface (or bottom surface) of each member or layer described hereinbelow are distinguished by the third direction DR3. However, the first to third direction axes DR1, DR2, and DR3 are used for example purposes, and directions indicated by the first to third direction axes DR1, DR2, and DR3 are relative concepts, and may be changed into other directions. Hereinafter, the first to third directions are directions respectively indicated by the first to third direction axes DR1, DR2, and DR3, and are designated by the same symbols.

The display device DD shown in FIG. 1 may have a planar display surface. However, the present disclosure is not necessarily limited thereto, and the display device DD in accordance with the embodiment of the present disclosure may have various types of display surfaces capable of displaying an image, such as a curved display surface and/or a stereoscopic display surface. When the display device DD in accordance with the embodiment of the present invention has a stereoscopic display surface, the stereoscopic display surface may include, for example, a plurality of display areas oriented in different directions. The stereoscopic display surface may be implemented as a polygonal columnar display surface.

In an embodiment, the display device DD may be a flexible display device. For example, the display device DD may be applied to a foldable display device, a bendable display device, a rollable display device, and the like. However, the present disclosure is not necessarily limited thereto, and the display device DD may be a rigid display device.

The display device DD shown in FIG. 1 illustrates a display device DD which may be applied to a smartphone terminal. However, this is only one example, and the display device DD may be applied to large electronic devices such as a television, a monitor, and an electric signboard, as well as to small and medium electronic devices such as a tablet, a navigation system, a game device, and a smart watch. Also, the display device DD may also be applied to wearable electronic devices such as a head-mounted display.

As shown in FIG. 1, the display surface DD-IS of the display device DD may include a display area DD-DA in which the image IM is displayed and a non-display area DD-NDA adjacent to the display area DD-DA. For example, the non-display area DD-NDA may be an area in which images are not displayed. The non-display region DD-NDA may be disposed at the outside (for example, around the lateral sides) of the display area DD-DA.

Figure 2:
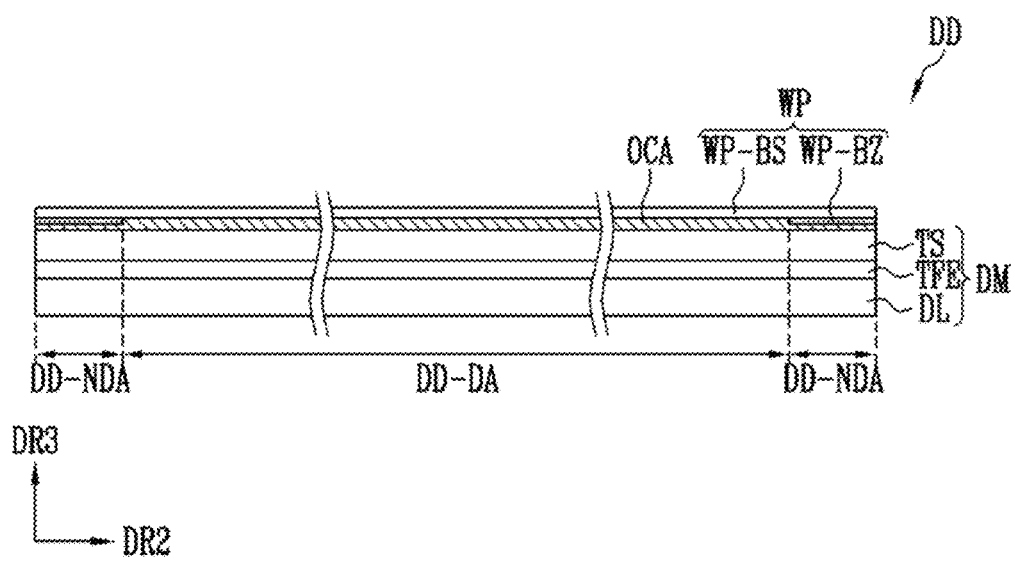
FIG. 2 is a cross-sectional view schematically illustrating a display device in accordance with embodiments of the present disclosure.

FIG. 2 is a cross-sectional view schematically illustrating a display device in accordance with embodiments of the present disclosure.

FIG. 2 illustrates a stacking relationship of functional panels and/or functional members, which constitute the display device DD.

Referring to FIGS. 1 and 2, the display device DD may include a display element layer DL, an encapsulation layer TFE, a touch sensor TS, and a window panel WP (or window).

In an embodiment, the display element layer DL, the encapsulation layer TFE, and the touch sensor TS may be formed through a continuous process. For example, the display element layer DL, the encapsulation layer TFE, and the touch sensor TS may be formed in a single, uninterrupted process. The window panel WP may be coupled to a component at an upper surface thereof through an adhesive member. The adhesive member may include an ordinary adhesive or glue. The adhesive member shown in FIG. 2 may be, for example, an optically transparent adhesive member (e.g., it may include Optically Clear Adhesive; OCA).

In an embodiment, the touch sensor TS may sense a contact or input from an external element such as a hand or pen to the display surface DD-IS of the display device DD.

In an embodiment, the encapsulation layer TFE and the display element layer DL may be defined as a display panel. The display element layer DL may include a light emitting element, transistors for driving the light emitting element, and lines (e.g., conductive lines and/or wires).

The encapsulation layer TFE may be disposed directly on the display element layer DL. As used herein, when component B is "directly disposed" or "disposed directly" on component A, this means that there are no intervening layers, such as separate adhesive layer/adhesive members, disposed between the component A and the component B. The component B may be formed through a continuous process after the component A is formed.

In an embodiment, the touch sensor TS may be disposed directly on the encapsulation layer TEE. The display element layer DL, the encapsulation layer TFE, and the touch sensor TS may be defined as a display module DM.

An optically transparent adhesive member OCA may be disposed between the display module DM and the window panel WP. For example, the optically transparent adhesive member OCA may be disposed between the display panel DM and the window panel WP to adhere the display panel DM and the window panel WP to each other.

In an embodiment, the display module DM may be a self-emissive display module, but is not necessarily limited thereto. For example, the display module DM may be an organic light emitting display module or a quantum dot light emitting display module.

In an embodiment, the window panel WP may include a base film WP-BS and a light blocking pattern WP-BZ. The base film WP-BS may include a glass substrate and/or a synthetic resin film. The base film WP-BS is not necessarily limited to a single layer. The base-film WP-BS may include two or more films coupled to each other through an adhesive member.

The light blocking pattern WP-BZ partially overlaps with the base film WP-BS in a thickness direction (e.g., DR3). The light blocking pattern WP-BZ may be disposed on a back surface of the base film WP-BS and define a bezel area of the display device DD, e.g., the non-display area DD-NDA.

The window panel WP may further include a functional coating layer disposed on a top surface and/or a bottom surface of the base film WP-BS. The functional coating layer may include an anti-fingerprint layer, an anti-reflection layer, a hard coating layer, or the like.

In an embodiment, an additional anti-reflection member may be further provided between the touch sensor TS and the optically transparent adhesive member OCA. The anti-reflection member decreases the reflexibility of external light incident onto the top of the window panel WP.

Figure 3:
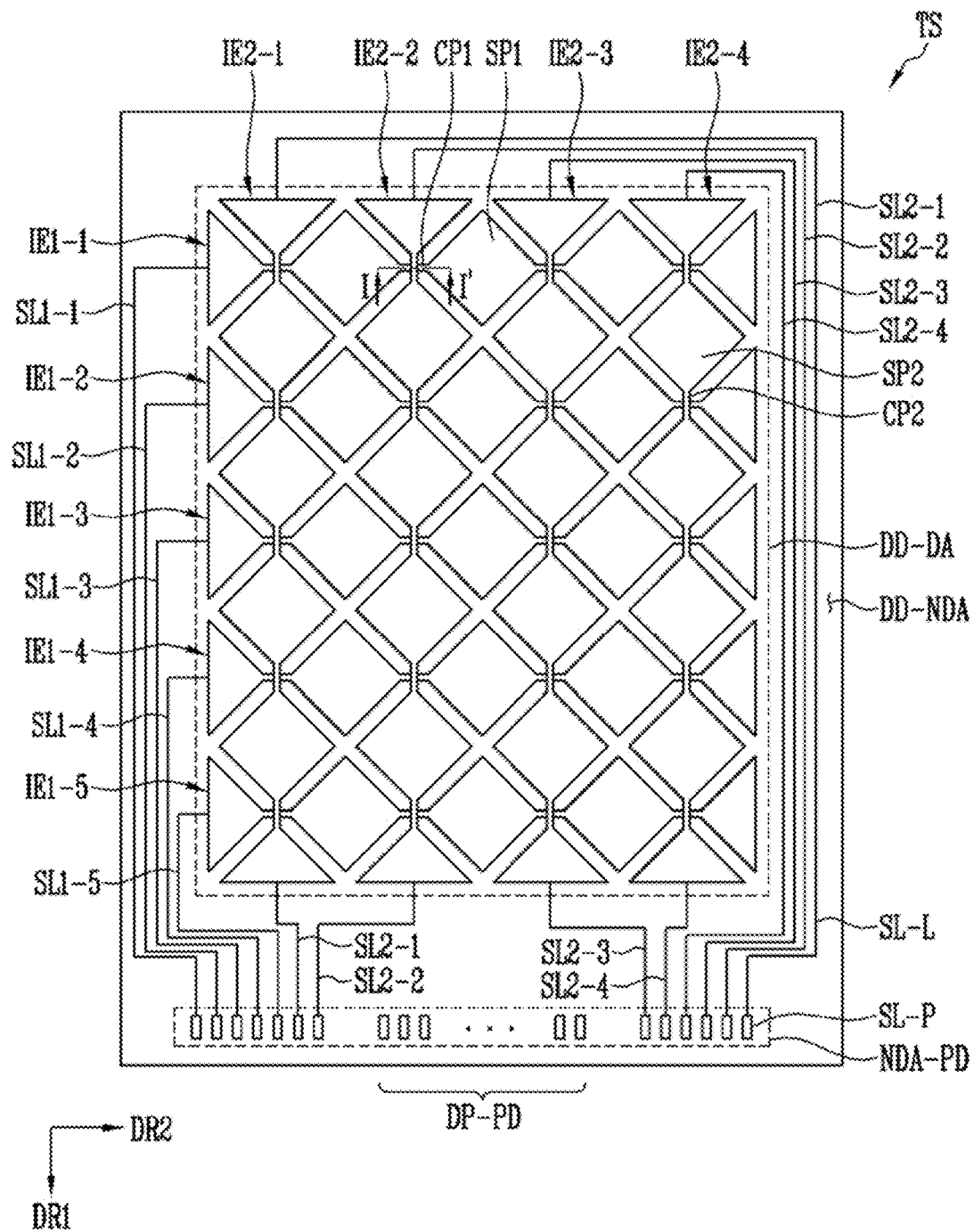
FIG. 3 is a plane view illustrating an example of a touch sensor included in the display device shown in FIG. 1.

FIG. 3 is a plane view illustrating an example of a touch sensor included in the display device shown in FIG. 1.

Referring to FIG. 3, a touch sensor TS may include first sensing electrodes IE1-1 to IE1-5, first signal lines SL1-1 to SL1-5 respectively connected to the first sensing electrodes IE1-1 to IE1-5, second sensing electrodes IE2-1 to IE2-4, and second signal lines SL2-1 to SL2-4 respectively connected to the second sensing electrodes IE2-1 to IE2-4.

In an embodiment, the touch sensor TS may further include an optical dummy electrode disposed in a boundary area between the first sensing electrodes IE1-1 to IE1-5 and the second sensing electrodes IE2-4 to IE2-4.

The first sensing electrodes IE1-1 to IE1-5 and the second sensing electrodes IE2-1 to IE2-4 intersect each other. The first sensing electrodes IE1-1 to IE1-5 may be arranged substantially in the first direction DR1. For example, the first sensing electrodes IE1-1 to IE1-S may form rows of electrodes from a plan view. The first sensing electrodes IE1-1 to IE1-5 may substantially extend in the second direction DR2. The second sensing electrodes IE2-1 to IE2-4 may be arranged substantially in the second direction DR2. For example, the second sensing electrodes IE2-1 to IE2-4 may form columns of electrodes from a plan view. The second sensing electrodes IE2-1 to IE2-4 may substantially extend in the first direction DR1. The first sensing electrodes IE1-1 to IE1-5 and the second sensing electrodes IE2-1 to IE2-4 may sense an external input by using a mutual capacitance method and/or a self-capacitance method.

Each of the first sensing electrodes IE1-1 to IE1-5 includes first sensor parts SP1 and first connection parts CP1. Each of the second sensing electrodes IE2-1 to IE2-4 includes second sensor parts SP2 and second connection parts CP2.

In an embodiment, the first sensing electrodes IE1-1 to IE1-5 and the second sensing electrodes IE2-1 to IE2-4 may have a shape (e.g., a bar shape) such that the sensor part and the connection part are not distinguished from each other. Although the first and second sensor parts SP1 and SP2 having a rhombic shape are illustrated in the Figures as an example, the present disclosure is not necessarily limited thereto, and the first and second sensor parts SP1 and SP2 may have another polygonal shape.

In an embodiment, the first sensing electrodes IE1-1 to IE1-5 and the second sensing electrodes IE2-1 to IE2-4 may be formed in a mesh pattern.

The first sensor parts SP1 in any given first sensing electrode are arranged along the second direction DR2, and the second sensor parts SP2 in any given second sensing electrode are arranged along the first direction DR1. Each of the connection parts CP1 connects adjacent first sensor parts SP1 to each other, and each of the second connection parts CP2 connects adjacent second sensor parts SP2 to each other.

In an embodiment, the second connection parts CP2, the first sensor parts SP1, and the second sensor parts SP2 may be disposed in the same layer, and the first connection parts CP1 may be disposed in a layer different from the layer of the second connection parts CP2, the first sensor parts SP1, and the second sensor parts SP2. Accordingly, the first sensing electrodes IE1-1 to 1E1-5 and the second sensing electrodes IE2-1 to IE2-4 may not electrically interfere (e.g., short-circuit) with each other.

The first signal lines SL1-1 to SL1-5 are each respectively connected to one end of the first sensing electrodes IE1-1 to IE1-5. The second signal lines SL2-1 to SL2-4 are each respectively connected to both ends of the second sensing electrodes IE2-1 to IE2-4. In an embodiment, the first signal lines SL1-1 to SL1-5 may each be respectively connected to both ends of the first sensing electrodes IE1-1 to IE1-5. In an embodiment, the second signal lines SL2-1 to SL2-4 may each be respectively connected to only one ends of the second sensing electrodes IE2-1 to IE2-4.

Each of the first signal lines SL1-1 to SL1-5 and the second signal lines SL2-1 to SL2-4 may include a line part SL-L and a pad part SL-P. The pad parts SL-P may be disposed in a pad area NDA-PD.

The touch sensor TS may include signal pads DP-PD. The signal pads DP-PD may be arranged in the pad area NDA-PD.

However, this is only one example, and the planar shape of the touch sensor TS is not necessarily limited thereto.

Figure 4:
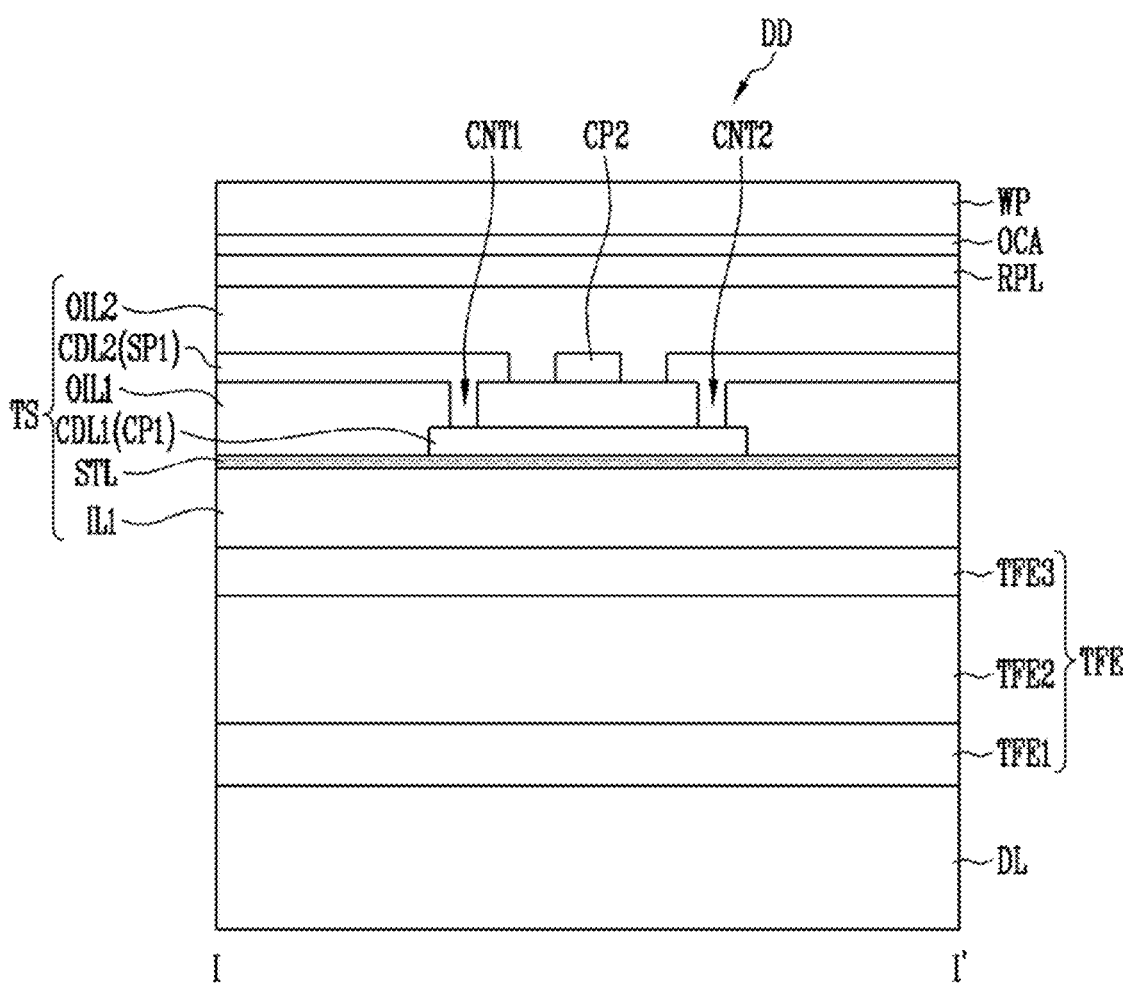
FIG. 4 is a cross-sectional view schematically illustrating an example of the display device including portion I-I' of the touch sensor shown in FIG. 3.
Figure 5A:
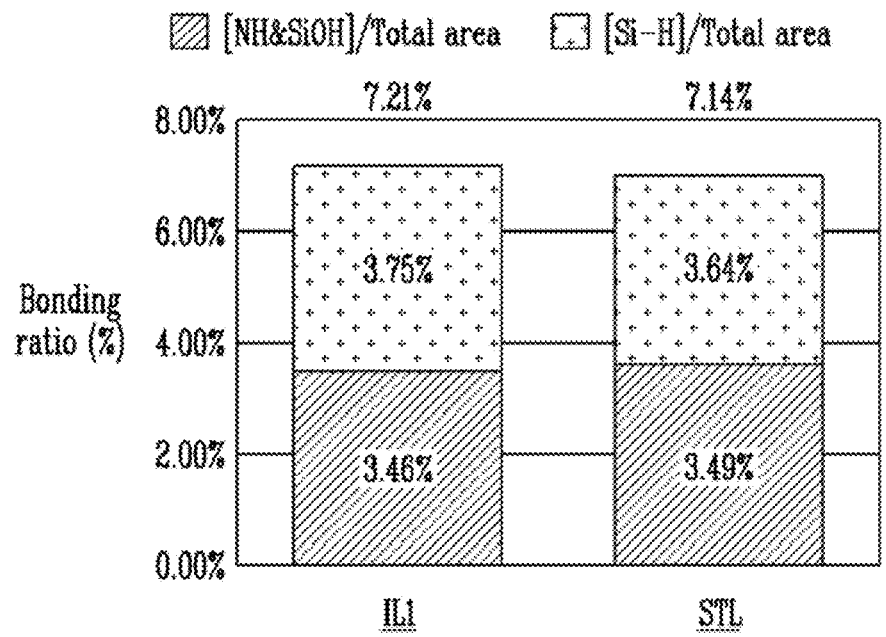
FIGS. 5A and 5B illustrate an example of a bonding ratio of elements included in a first inorganic insulating layer and a surface reinforcing layer, which are shown in FIG. 4.
Figure 5B:
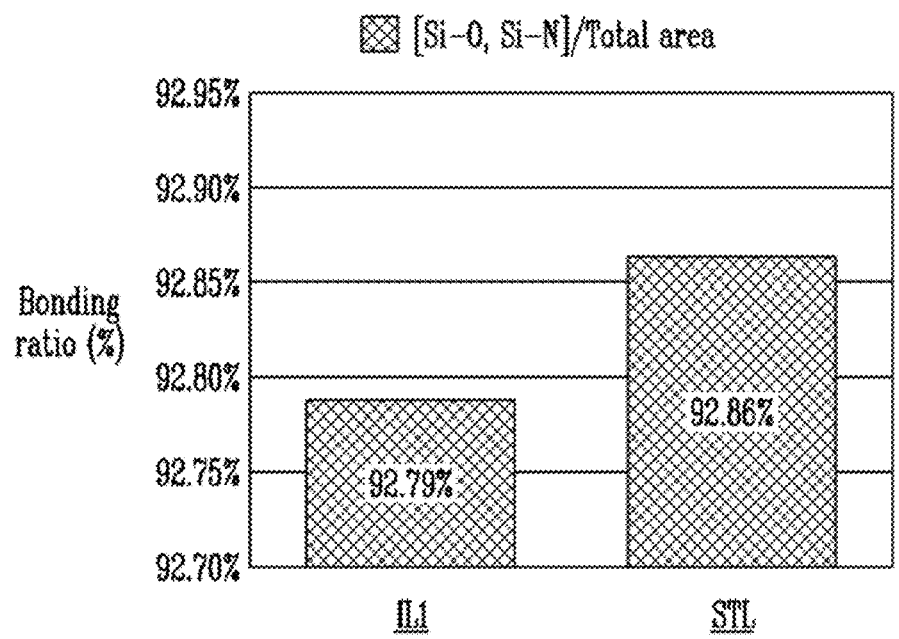

FIG. 4 is a cross-sectional view schematically illustrating an example of the display device including portion I-I' of the touch sensor shown in FIG. 3. FIGS. 5A and 5B illustrate an example of a bonding ratio of elements included in a first inorganic insulating layer and a surface reinforcing layer, which are shown in FIG. 4.

Referring to FIGS. 2, 3, 4, 5A, and 5B, the display device DD may include a display element layer DL, an encapsulation layer TFE, and a touch sensor TS. The display device DD may further include an anti-reflection layer RPL and a window panel WP.

The whole or a portion of the display device DD may have flexibility. For example, the entire display device DD or a portion of the display device DD may be configured to be bent, folded, and/or rolled without damage.

The display element layer DL may include circuit elements such as transistors disposed on a base layer (substrate, such as a synthetic resin layer), and a light emitting element connected to the circuit elements. The circuit elements may include a signal line, a pixel circuit, and the like. The light emitting element may be formed on the circuit elements.

In some embodiments, the light emitting element may be an organic light emitting element, an inorganic light emitting element, or a light emitting element including a combination of an inorganic material and an organic material. However, these are only a few examples, and the display element layer DL may include a light emitting element and/or circuit elements, used to implement a liquid crystal display device, a plasma display device, a display device having quantum dots, and the like.

The encapsulation layer TFE may be disposed on the display element layer DL. The encapsulation layer TFE may seal the display element layer DL. The encapsulation layer TFE may have flexibility.

The encapsulation layer TFE may include at least one insulating layer. In an embodiment, the encapsulation layer TFE may include at least one encapsulation organic layer TFE2 and encapsulation inorganic layers TE1 and TFE3 respectively provided on a top surface and a bottom surface of the at least one encapsulation organic layer TFE2. For example, the encapsulation layer TFE may include a first encapsulation inorganic layer TFE1, an encapsulation organic layer TFE2, and a second encapsulation inorganic layer TFE3, which are sequentially stacked on the display element layer DL. However, this is only one example, and the number of encapsulation organic layers and encapsulation inorganic layers is not necessarily limited thereto. For example, a plurality of encapsulation organic layers and a plurality of encapsulation inorganic layers may be alternately stacked. An uppermost layer of the encapsulation layer TFE may be configured as an inorganic layer.

The encapsulation inorganic layers TFE1 and TFE3 may protect the display element layer DL from moisture and oxygen, and the encapsulation organic layer TFE2 may protect the display element layer DL from foreign matter such as dust particles. The encapsulation inorganic layers TFE1 and TFE3 may include silicon nitride, silicon oxynitride, silicon oxide, titanium oxide, aluminum oxide, or the like. However, the present disclosure is not necessarily limited thereto, and the encapsulation inorganic layers TFE1 and TFE3 may be made of an inorganic material capable of protecting the display element layer DL from moisture and oxygen. The encapsulation organic layer TFE2 may include an acryl-based organic layer. However, the present disclosure is not necessarily limited thereto, and the encapsulation organic layer TFE2 may be made of an organic material capable of protecting the display element layer DL from foreign matter such as dust particles.

The touch sensor TS may be formed on the second encapsulation inorganic layer TFE3 through a continuous process. In an embodiment, the touch sensor TS may include an inorganic insulating layer IL1 (or first inorganic insulating layer), a surface reinforcing layer STL, a first conductive layer CDL1, a first insulating layer OIL1, a second conductive layer CDL2, and a second organic insulating layer OIL2.

The inorganic insulating layer IL1 may be provided on the second encapsulation inorganic layer TFE3. In an embodiment, the inorganic insulating layer IL1 may be deposited on the second encapsulation inorganic layer TFE3 through various Chemical Vapor Deposition (CVD) processes. For example, the inorganic insulating layer IL1 may be stacked through Plasma Enhanced Chemical Vapor Deposition (PECVD).

The inorganic insulating layer IL1 may include at least one of silicon oxide, silicon nitride, and silicon oxynitride. In some embodiments, the inorganic insulating layer IL1 and the second encapsulation inorganic layer TFE3 may substantially include the same material.

The inorganic insulating layer IL1 may serve as a base layer of the touch sensor TS.

The inorganic insulating layer IL1 and the second encapsulation inorganic layer TFE3 may be formed through their own respective processes in different conditions. Therefore, the interface between the inorganic insulating layer IL1 and the second encapsulation inorganic layer TFE3 may be distinguished from both layers. However, this is only one example, and the inorganic insulating layer IL1 and the second encapsulation inorganic layer TFE3 may be integrated through one process, and be formed as one inorganic insulating layer.

The surface reinforcing layer STL may be formed on the inorganic insulating layer IL1 by surface treatment on the inorganic insulating layer IL1. In an embodiment, the surface reinforcing layer STL may be formed by performing hydrogen plasma treatment on a surface of the inorganic insulating layer IL1. For example, the hydrogen plasma treatment may be performed for a predetermined time while hydrogen gas is supplied to the surface of the inorganic insulating layer IL1 under a predetermined pressure and temperature. The hydrogen plasma treatment may be performed so that the film density of a top surface of the inorganic insulating layer IL1 can be increased.

As described above, the hydrogen-plasma-treated portion of the inorganic insulating layer IL1 may be defined as the surface reinforcing layer STL. In the description of this embodiment, the surface reinforcing layer STL as distinguished from the inorganic insulating layer IL1 will be described.

The surface reinforcing layer STL may have a film density higher than that of the inorganic insulating layer IL1. For example, materials (molecules) in the surface reinforcing layer STL may be arranged more densely than materials (molecules) in the inorganic insulating layer IL1.

FIG. 5A illustrates an example in which bonding ratios of hydrogen and other atoms in both the surface reinforcing layer STL and the inorganic insulating layer IL1 are experimentally determined. FIG. 5B illustrates an example in which bonding ratios of silicon and oxygen and silicon and nitrogen in both the surface reinforcing layer STL and the inorganic insulating layer IL1 are experimentally derived. In general, a hydrogen atom, etc. may be included in the inorganic insulating layer IL1 due to infiltration of a residual material or other external materials, generated during a process.

Molecules and atoms in the inorganic insulating layer IL1 may be rearranged and recombined through the hydrogen plasma treatment on the surface of the inorganic insulating layer IL1. As shown in FIG. 5A, a total sum of the bonding ratio between hydrogen ion and other atoms and the bonding ratio between hydroxyl ion and other atoms with respect to the entire area of the surface reinforcing layer STL may be less than in the sum of the ratios with respect to the entire area of the surface of the inorganic insulating layer IL1. By way of contrast, as shown in FIG. 5B, a total sum of bonding ratios between oxygen/nitrogen and silicon with respect to the entire area of the surface reinforcing layer STL may be greater than the total sum of bonding ratios for the inorganic insulating layer IL1.

For example, by the hydrogen plasma treatment, existing molecular bonding having a relatively weak bonding force, such as bonding between hydrogen ion and other atoms in the surface reinforcing layer STL, may be broken, and bonding between oxygen/nitrogen and silicon, which has a relatively strong bonding force, may be increased. Accordingly, as a result of a difference between component bonding ratios as shown in FIGS. 5A and 5B, the film density of the surface reinforcing layer STL may be higher than that of the inorganic insulating layer IL1.

The surface reinforcing layer STL may have a thickness determined by the hydrogen plasma treatment conditions, such as time, pressure, and temperature. For example, when the hydrogen plasma treatment time increases under the same pressure and temperature condition, the thickness (depth) of the surface reinforcing layer STL may be increased, and correspondingly, the thickness of the inorganic insulating layer IL1 may be decreased.

In some embodiments, the surface reinforcing layer STL may be provided with a thickness of about 200 Å. However, this is only one example, and the thickness of the surface reinforcing layer STL is not necessarily limited thereto.

The first conductive layer CDL1 may be provided on the surface reinforcing layer STL.

In an embodiment, the first connection parts CP1 may be formed from the first conductive layer CDL1. The first sensor parts SP1, the second sensor parts SP2, and the second connection parts CP2 may be formed from the second conductive layer CDL2.

Alternatively, in an embodiment, the first sensor parts SP1, the second sensor parts SP2, and the second connection parts CP2 may be formed from the first conductive layer CDL1. The first connection parts CP1 may be formed from the second conductive layer CDL2.

In the embodiments of the present disclosure, a case where the first connection parts CP1 are formed from the first conductive layer CDL1 will be assumed and described.

In an embodiment, the first conductive layer CDL1 may include an opaque metal. For example, the first conductive layer CDL1 may not allow visible light to pass through it. For example, the first conductive layer CDL1 may include molybdenum, silver, titanium, copper, aluminum, and any alloy thereof. The first conductive layer CDL1 may have a multi-layered structure. For example, the first conductive layer CDL1 may have a triple structure of molybdenum (Mo)/aluminum (Al)/molybdenum (Mo). However, this is only one example, and the first conductive layer CDL1 may have a triple structure of titanium (Ti)/aluminum (AI)/titanium (Ti).

In an embodiment, the first conductive layer CDL1 may include a transparent conductive material. For example, in this embodiment, the first conductive layer CDL1 may allow incident visible light to substantially pass through. For example, the transparent conductive material may include a transparent conductive oxide such as indium tin oxide (ITO), indium zinc oxide (IZO), zinc oxide (ZnO), or indium tin zinc oxide (ITZO). Additionally or alternatively, the transparent conductive material may include conductive polymer such as PEDOT, metal nanowire, graphene, etc.

The first conductive layer CDL1 may be formed through patterning using various processes such as dry etching and wet etching applied to a conductive material deposited on the surface reinforcing layer STL.

The first organic insulating layer OIL1 may be provided on the surface reinforcing layer STL and cover the first conductive layer CDL1. The first organic insulating layer OIL1 may include contact holes CNT1 and CNT2. Portions of the first conductive layer CDL1 may be exposed through the contact holes CNT1 and CNT2.

The first organic insulating layer OIL1 may have a single- or multi-layered structure. In an embodiment, the first organic insulating layer OIL1 may include photoresist, acryl-based polymer, polyimide-based polymer, polyamide-based polymer, siloxane-based polymer, novolak resin, and/or alkali-soluble resin, etc.

The first organic insulating layer OIL1 may be formed through various organic deposition and patterning processes. For example, the first organic insulating layer OIL1 may be patterned to have the contact holes CNT1 and CNT2 through a photolithography process after photoresist deposition.

The second conductive layer CDL2 may be provided on the first organic insulating layer OIL1. In embodiments of the present disclosure, the first sensor parts SP1, the second sensor parts SP2, and the second connection parts CP2 may be formed from the second conductive layer CDL2. The second conductive layer CDL2 may be connected to the first conductive layer CDL1 through the contact holes CNT1 and CNT2.

In an embodiment, the second conductive layer CDL2 may include the transparent conductive material described. Alternatively, the second conductive layer CDL2 may include the opaque metal described above.

The first conductive layer CDL1 and the second conductive layer CDL2 may have the same material, or include different materials.

The second organic insulating layer OIL2 may be provided on the first organic insulating layer OIL1 and cover the second conductive layer CDL2. The second organic insulating layer OIL2 may have a single- or multi-layered structure.

The second organic insulating layer OIL2 may include at least one of the organic materials described above. The second organic insulating layer OIL2 may be formed through various organic deposition and patterning processes.

As described above, insulating layers of the touch sensor TS may be provided as the first and second organic insulating layers OIL1 and OIL2 instead of the existing inorganic insulating layer such as silicon oxide, so that bending characteristics of the touch sensor TS and the display device DD can be enhanced. However, the organic insulating layer has a relatively low film density, as compared with the inorganic insulating layer.

In a high temperature state, gas (bubbles) may be generated in inorganic layers (e.g., the inorganic insulating layer IL1 and/or the second encapsulation inorganic layer TFE3) under the first organic insulating layer OIL1. The gas may be out-gassed near and/or toward the first organic insulating layer OIL1 and the second organic insulating layer OIL2. The first organic insulating layer OIL1 and the second organic insulating layer OIL2, which have a low film density, may not effectively block the movement of the gas, and the gas moves upwardly by passing through the first organic insulating layer OIL1 and the second organic insulating layer OIL2.

In this case, the gas remains as bubbles between the window panel WP and an optically transparent adhesive member OCA, and will result in a visual defect that may be perceived as a "snowflake shape" by a user.

To remove the snowflake bubble defect, the movement of the gas may be blocked by increasing the film density of an upper portion of the inorganic insulating layer IL1 including an inorganic material. However, when the film density of the entire inorganic insulating layer IL1 is increased, the second encapsulation inorganic layer TFE3 having a relatively low film density may be pulled up by the inorganic insulating layer IL1 having a relatively high density, and lifting of the inorganic insulating layer IL1 and/or the second encapsulation inorganic layer TFE3 may occur.

In a display device according to aspects of the present disclosure, the surface reinforcing layer STL is provided on the inorganic insulating layer IL1 so as not only to improve the bending characteristics of the touch sensor TS, but also to prevent the snowflake bubble defect and the lifting of the lower inorganic layer (e.g., the inorganic insulating layer IL1 and/or the second encapsulation inorganic layer TFE3).

The surface reinforcing layer STL may have a relatively high film density, and block gas out-gassed from the inorganic layers beneath it from passing through the first organic insulating layer OIL1 above it. For example, the film density of the surface reinforcing layer STL may be about 2.07 g/cm$^3$ or higher.

Also, the hydrogen-plasma-treated surface reinforcing layer STL may prevent moisture permeability, and may further have a low reactivity with moisture. Further, the surface reinforcing layer STL may be resistant to strong physical stresses in a high-temperature, high-humidity environment.

As described above, the surface reinforcing layer STL blocks passage of the gas transferred from the inorganic insulating layer IL1 and the inorganic layers thereunder in a high-temperature environment, and is resistant to temperature change, moisture permeability, oxidation, etc. Thus, the snowflake bubble defect of the display device DD and the touch sensor TS may be removed, bending capability can be increased, and surface encapsulation characteristics can be reinforced.

In an embodiment, the anti-reflection layer RPL may be provided on the touch sensor TS. The anti-reflection layer RPL decreases the reflexibility of external light incident from the top of the window panel WP. In an embodiment, the anti-reflection layer RPL may include a retarder and/or polarizer. The retarder may be of a film type or a liquid crystal coating type, and may include $\lambda/2$ retarder (e.g., half-wave plate) and/or a $\lambda/4$ retarder (e.g., quarter-wave plate). The polarizer may also be of a film type or a liquid crystal coating type.

In an embodiment, the anti-reflection layer RPL may further include color filters. The color filters may have a predetermined arrangement. The arrangement of the color filters may be determined by the light emitting colors of pixels included in the display element layer DL. The anti-reflection layer RPL may further include a black matrix adjacent to the color filters.

In an embodiment, the anti-reflection layer RPL may include a destructive interference structure. For example, the destructive interference structure may include a first reflective layer and a second reflective layer, which different from each other. First reflected light and second reflected light, which are respectively reflected from the first reflective layer and the second reflective layer, may be destructively interfered with each other, and accordingly, the reflexibility of external light is decreased.

The optically transparent adhesive member OCA may be provided on the anti-reflection layer RPL, and the window panel WP may be bonded to an upper surface of the anti-reflection layer RPL through the adhesive member.

Figure 6A:
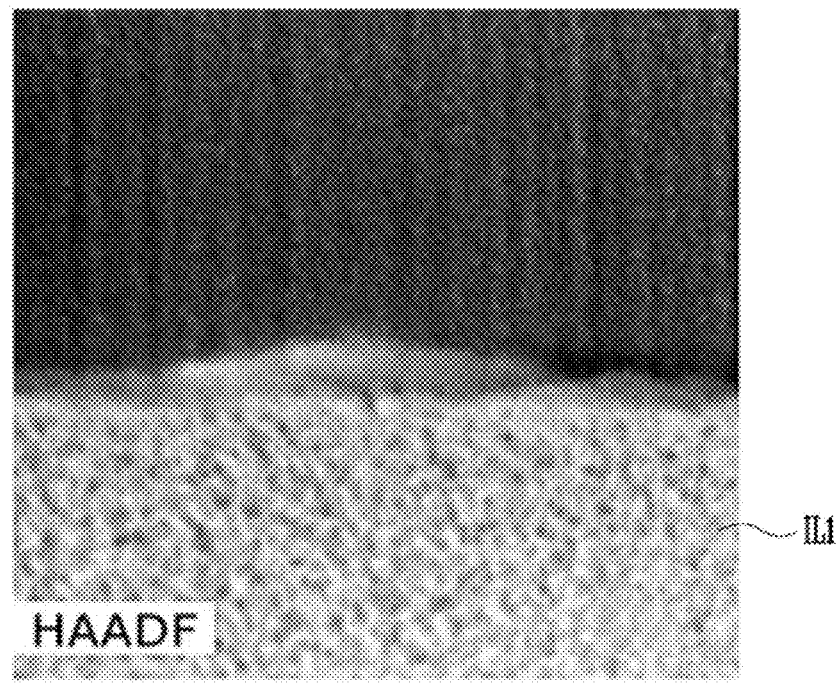
FIG. 6A is an example image of a surface-untreated inorganic insulating layer acquired through a transmission electron microscope.
Figure 6B:
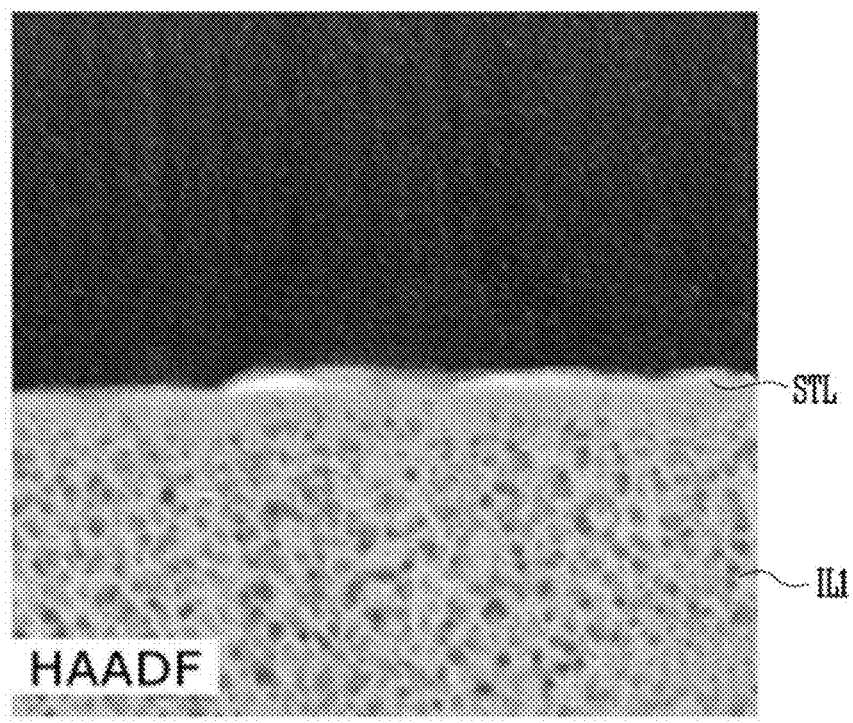
FIG. 6B is an example image of a surface-treated inorganic insulating layer acquired through the transmission electron microscope.

FIG. 6A is an example image of a surface-untreated inorganic insulating layer acquired through a transmission electron microscope. FIG. 6B is an example image of a surface-treated inorganic insulating layer acquired through the transmission electron microscope.

Referring to FIGS. 4, 6A, and 6B, the touch sensor TS of the display device DD may include the inorganic insulating layer IL1 and the surface reinforcing layer STL.

FIGS. 6A and 6B show High-Angle Annular Dark Field (HAADF) transmission electron images acquired through the transmission electron microscope. In particular, the image shown in FIG. 6B shows an example in which the surface reinforcing layer STL is formed by performing hydrogen plasma treatment on the surface of the inorganic insulating layer IL1. The image shown in FIG. 6B shows the surface reinforcing layer STL formed by performing the hydrogen plasma treatment on the surface of the inorganic insulating layer IL1 has a thickness of about 200 Å.

In an embodiment, the thickness of the surface reinforcing layer STL may be in a range of a few tens of Å to a few hundreds of A. For example, the thickness of the surface reinforcing layer STL may be 10 Å to 500 Å.

A density (film density) of a surface (interface) of the surface-untreated inorganic insulating layer IL1 may be lower than that of a surface (interface) of the hydrogen-plasma-treated inorganic insulating layer IL1. An example of this difference between the film densities can be seen through comparison of FIGS. 6A and 6B.

For example, as shown in FIG. 6A, in the acquired image, the surface (interface) of the surface-untreated inorganic insulating layer IL1 is represented as relatively dark, and a plurality of black spots may be seen.

However, as shown in FIG. 6B, the surface reinforcing layer STL formed by the hydrogen plasma treatment may have a film density higher than that of the inorganic insulating layer IL1, and is represented brighter than the inorganic insulating layer IL1. Accordingly, an interface between the surface reinforcing layer STL and the inorganic insulating layer IL1 can be seen. For example, any black spots visible before treatment of the inorganic insulating layer IL1 at its surface may no longer be visible after treatment of the inorganic insulating layer IL1 and the formation of the surface reinforcing layer STL.

The first organic insulating layer OIL1, the first conductive layer CDL1, or another inorganic insulating layer may be formed on the surface reinforcing layer STL. The first organic insulating layer OIL1, the first conductive layer CDL1, and the other inorganic insulating layer are made of a material different from that of the surface reinforcing layer STL, and therefore, another layer different from the surface reinforcing layer STL may be displayed on the image of the transmission electron microscope.

As described above, the presence of the surface reinforcing layer STL formed by the hydrogen plasma treatment on the inorganic insulating layer IL1 and the thickness of the surface reinforcing layer STL may be seen by the image through the transmission electron microscope.

Figure 7:
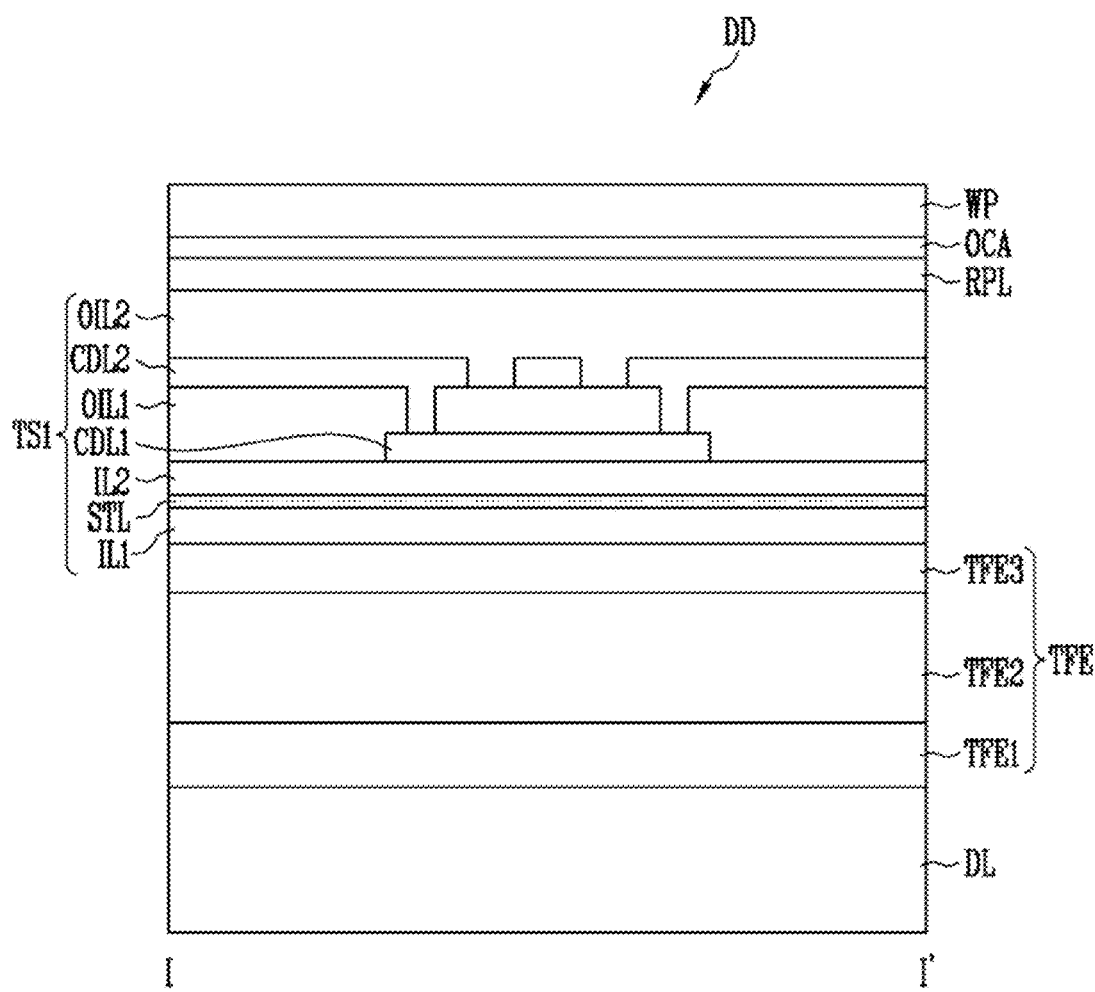
FIGS. 7 and 8 are cross-sectional views illustrating other examples of the display device shown in FIG. 4.
Figure 8:
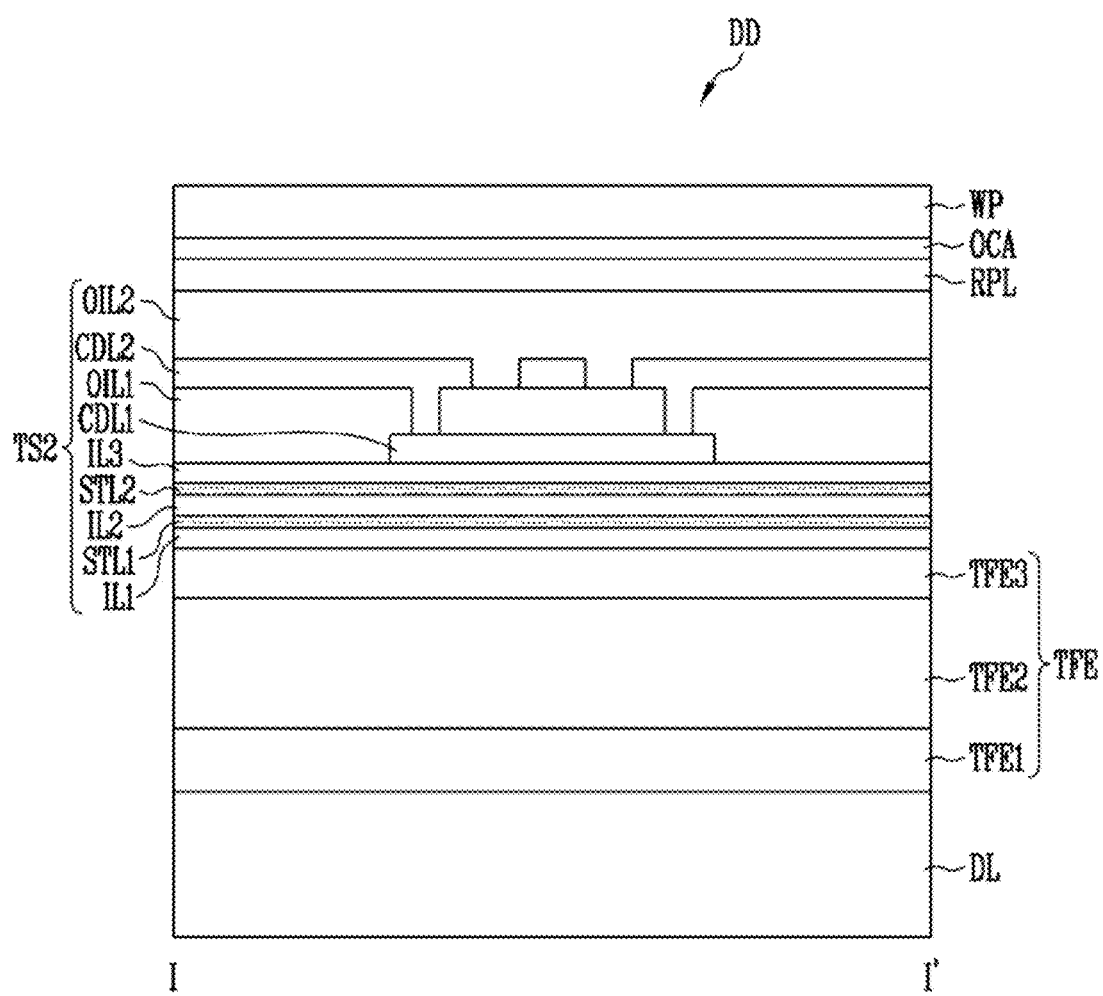

FIGS. 7 and 8 are cross-sectional views illustrating other examples of the display device shown in FIG. 4.

In FIGS. 7 and 8, components identical to those described with reference to FIG. 4 are designated by like reference numerals, and their overlapping descriptions will be omitted. To the extent that a description of an element has been omitted, it may be understood that the element is at least similar to corresponding elements that are described elsewhere in the specification. In addition, display devices shown in FIGS. 7 and 8 may be configured to be similar to the display device shown in FIG. 4, except for configurations of inorganic insulating layers IL2 and IL3 and surface reinforcing layers STL1 and STL2, which are included in the touch sensors TS1 and TS2.

Referring to FIGS. 7 and 8, each display device DD may include a display element layer DL, an encapsulation layer TFE, and a touch sensor TS1 or TS2. The display device DD may further include an anti-reflection layer RPL and a window panel WP.

In an embodiment, as shown in FIG. 7, a surface reinforcing layer STL may be provided on a first inorganic insulating layer IL1, and a second inorganic insulating layer IL2 may be provided between the surface reinforcing layer STL and a first conductive layer CDL1. The second inorganic insulating layer IL2 may be deposited on the surface reinforcing layer STL through a chemical vapor deposition process. The second inorganic insulating layer IL2 may include silicon oxide, silicon nitride, and/or silicon oxynitride. In some embodiments, the first inorganic insulating layer IL1 and the second inorganic insulating layer IL2 may include substantially the same material.

A first organic insulating layer OIL1 and the first conductive layer CDL1 may be formed directly on the second inorganic insulating layer IL2. This process may provide increase reliability, as compared with a stack structure in which the first organic insulating layer OIL1 and the first conductive layer CDL1 are formed directly on the surface reinforcing layer STL.

The thickness of the second inorganic insulating layer IL2 on the surface reinforcing layer STL may be relatively thin, and accordingly, outgassing from the second inorganic insulating layer IL2 may be neglected.

In an embodiment, as shown in FIG. 8, the touch sensor TS2 may include surface reinforcing layers STL1 and STL2 of a multi-layered structure. Thus, the effect of gas transfer toward the organic insulating layers OIL1 and OIL2 from inorganic layers under the first organic insulating layer OIL1 can be further reduced.

For example, a first surface reinforcing layer STL1 may be disposed on the first inorganic insulating layer IL1, the second inorganic insulating layer IL2 may be disposed on the first surface reinforcing layer STL1, and a second surface reinforcing layer STL2 may be disposed on the second inorganic insulating layer IL2. In addition, a third inorganic insulating layer IL3 may be disposed on the second surface reinforcing layer STL2. The first conductive layer CDL1 and the first organic insulating layer OIL1 may be formed directly on the third inorganic insulating layer IL3.

However, this is only one example, and the third inorganic insulating layer IL3. The first conductive layer CDL1 and the first organic insulating layer OIL1 may be formed on or otherwise be in contact with the second surface reinforcing layer STL2.

In some embodiments, the touch sensor TS2 may include three or more surface reinforcing layers under the first organic insulating layer OIL1.

Figure 9:
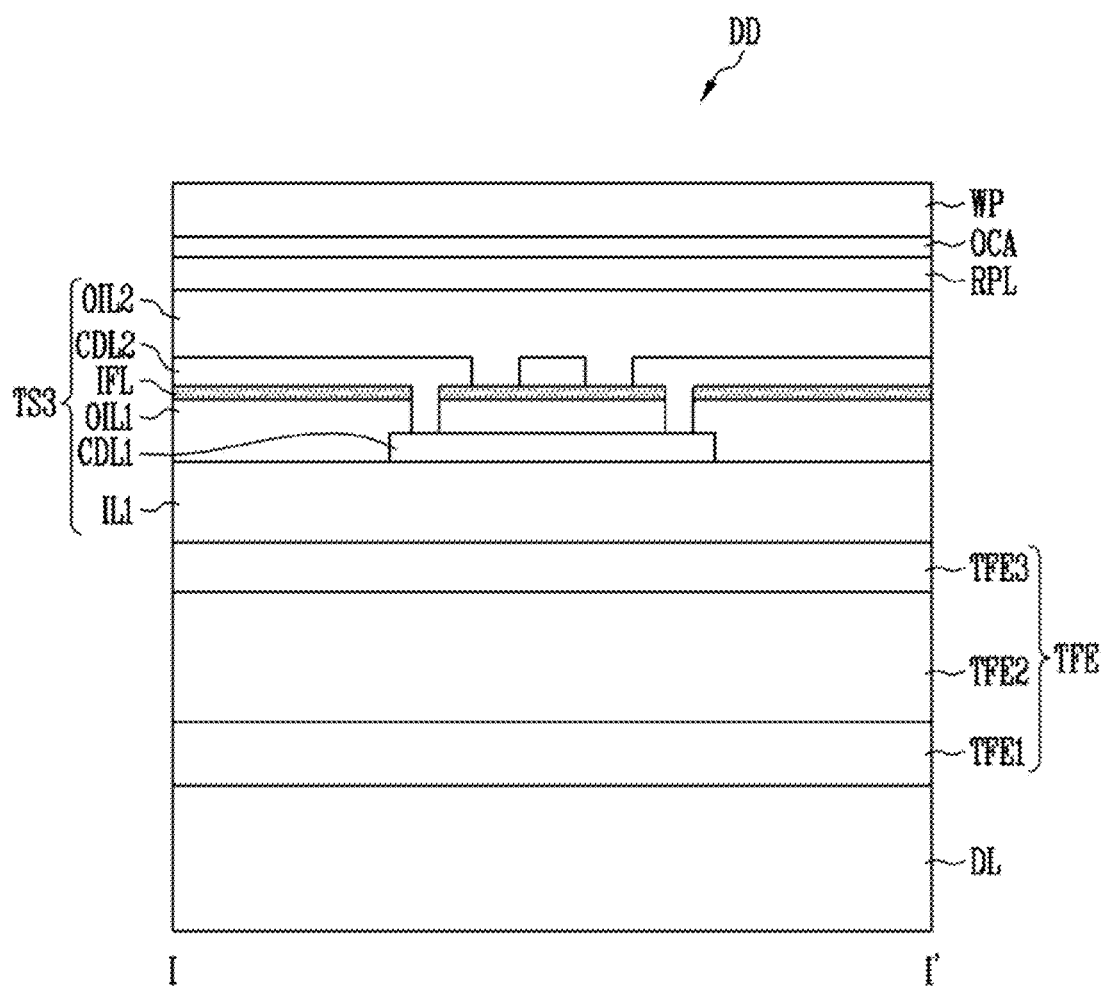
FIG. 9 is a cross-sectional view schematically illustrating an example of the display device including the portion I-I' of the touch sensor shown in FIG. 3.

FIG. 9 is a cross-sectional view schematically illustrating an example of the display device including the portion I-I' of the touch sensor shown in FIG. 3.

In FIG. 9, components identical to those described with reference to FIG. 4 are designated by like reference numerals, and their overlapping descriptions will be omitted. In addition, a display device shown in FIG. 9 may be configured similar to the display device shown in FIG. 4, except the display device of FIG. 9 includes a configuration of an inorganic material infiltration layer IFL included in a touch sensor TS3.

Referring to FIGS. 2, 3, and 9, the display device DD may include a display element layer DL, an encapsulation layer TFE, and the touch sensor TS3. The display device DD may further include an anti-reflection layer RPL and a window panel WP.

The touch sensor TS3 may include an inorganic insulating layer IL1, a first conductive layer CDL1, a first organic insulating layer OIL1, the inorganic material infiltration layer IFL, a second conductive layer CDL2, and a second organic insulating layer OIL2. In an embodiment, the first conductive layer CDL1 and the first organic insulating layer OIL1 may be disposed directly on the inorganic insulating layer IL1.

The inorganic material infiltration layer IFL may be provided on a surface of the first organic insulating layer OIL1. The inorganic material infiltration layer IFL may include an organic material the same as or similar to the first organic insulating layer OIL1 as well as an inorganic material infiltrating into a free volume of the surface of the first organic insulating layer OIL1.

The first organic insulating layer OIL1 may have a film density lower than that of the organic insulating layer IL1. The first organic insulating layer OIL1 may have a free volume relatively greater than that of the inorganic insulating layer IL1.

Meanwhile, a portion including the inorganic material infiltrating in a depth direction (e.g., a vertical direction facing the inorganic insulating layer IL1) from the surface of the first organic insulating layer OIL1 in the whole of the first organic insulating layer OIL1 may be defined as the inorganic material infiltration layer IFL. For example, the inorganic material infiltration layer IFL may be formed substantially along an upper surface of the first organic insulating layer OIL1 by infiltrating (e.g., injecting, e.g., under pressure) an inorganic material into the free volume of the first organic insulating layer OIL1. In the embodiment of the present disclosure, for convenience of description, the inorganic material infiltration layer IFL distinguished from the first organic insulating layer OIL1 will be described.

In an embodiment, the inorganic material infiltration layer IFL may be formed on the first organic insulating layer OIL1 through an Atomic Layer Deposition (ALD) process. An inorganic compound from a combination of a material included in a source gas as a precursor and a material included in a reaction gas may be formed in the free volume of the surface of the first organic insulating layer OIL1 through the ALD process.

In some embodiments, the source gas may include a precursor in which at least one of aluminum (Al), hafnium (Hf), titanium (Ti), zirconium (Zr), tantalum (Ta), and silicon (Si) and another subsidiary material are combined. In addition, the reaction gas may include oxygen radical.

Accordingly, the inorganic material filled in the free volume may include at least one selected from the group consisting of aluminum oxide, hafnium oxide, titanium oxide, zirconium oxide, tantalum oxide, silicon oxide, silicon nitride, and silicon oxynitride.

As described above, in the current embodiment, the inorganic material (inorganic compound) is filled in the free volume of the surface of the first organic insulating layer OIL1, and therefore, the inorganic material infiltration layer IFL may have a film density higher than that of the first organic insulating layer OIL1. For example, the film density of the inorganic material infiltration layer IFL may be about 2.07 g/cm$^3$ or higher. Thus, encapsulation characteristics of the first organic insulating layer OIL1 can be increased by the inorganic material infiltration layer IFL. For example, the inorganic material infiltration layer IFL may block passage of gas (bubbles) transferred from the inorganic insulating layer IL1 and the inorganic layers thereunder in a high-temperature environment, and prevent moisture permeability from the outside.

In addition, the inorganic material infiltration layer IFL having a very thin thickness can be formed through the ADL process, and thus the bending capability of the touch sensor TS3 including the first organic insulating layer OIL1 may be maintained.

Meanwhile, the thickness of the inorganic material infiltration layer IFL may be determined according to a number of times each step of the ALD process is repeated and/or a process time for each step. For example, when the supply time of the source gas increases, the precursor may infiltrate more deeply into the first organic insulating layer OIL1.

Meanwhile, when the thickness of the inorganic material infiltration layer IFL increases, the thickness of the first organic insulating layer OIL1 may decrease corresponding to the increase in the thickness of the inorganic material infiltration layer IFL.

The inorganic material infiltration layer IFL and the first organic insulating layer OIL1 may include contact holes. Portions of the first conductive layer CDL1 may be exposed through the contact holes.

The second conductive layer CDL2 may be provided on the inorganic material infiltration layer IFL. The second conductive layer CDL2 may be connected to the first conductive layer CDL1 through the contact holes.

Accordingly, the inorganic material infiltration layer IFL may include organic and inorganic components, and perform at least some of the functions provided by the surface reinforcing layer(s) of other embodiments as described above.

Figure 10:
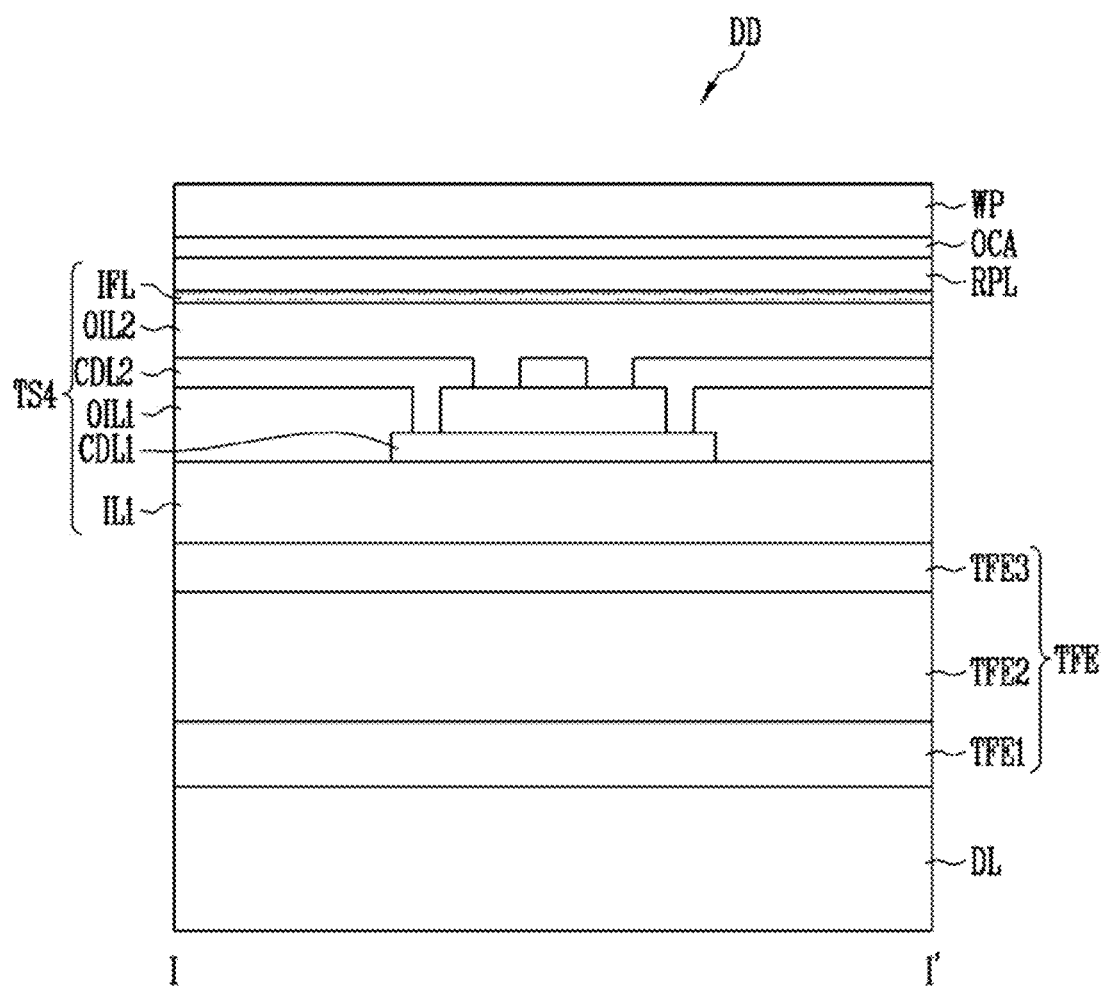
FIGS. 10 and 11 are cross-sectional views illustrating other examples of the display device shown in FIG. 9.
Figure 11:
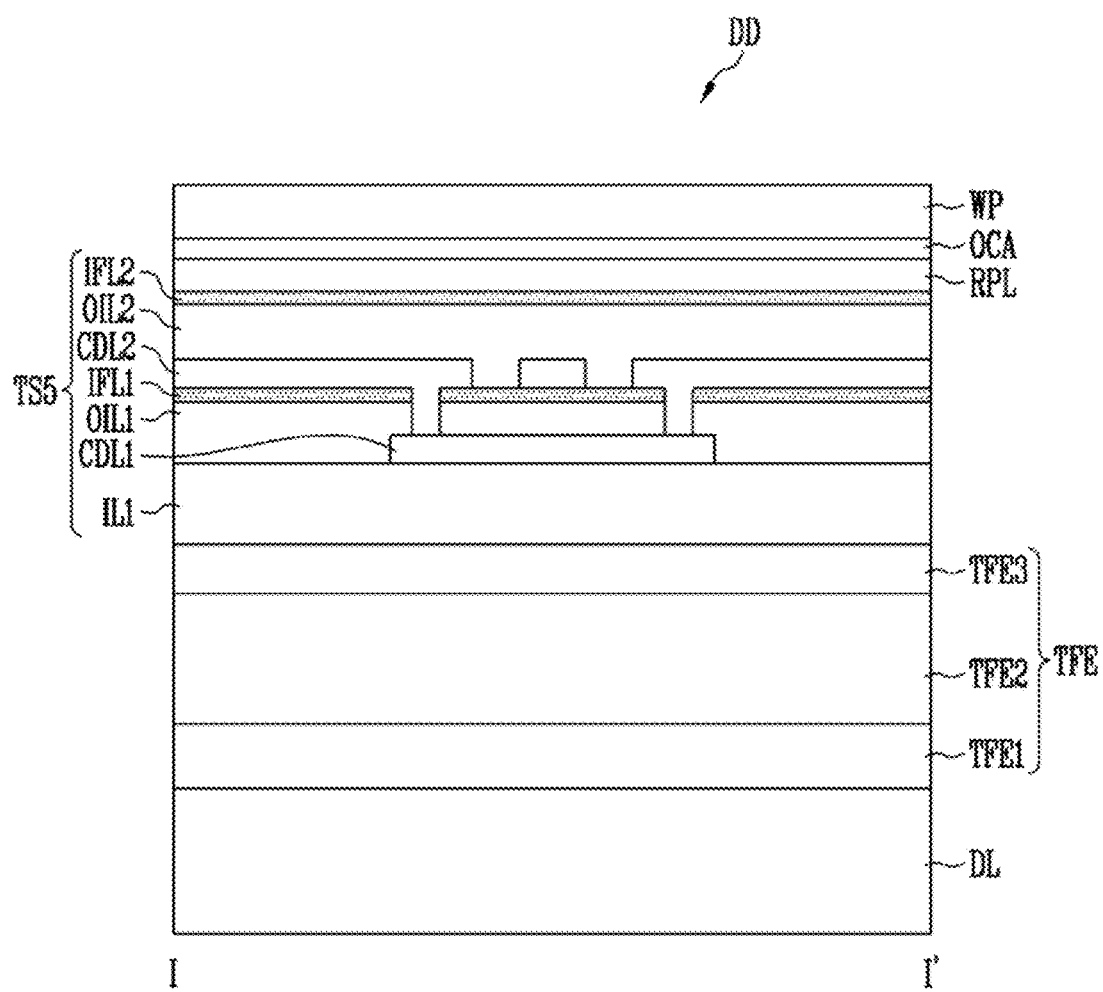

FIGS. 10 and 11 are cross-sectional views illustrating other examples of the display device shown in FIG. 9.

In FIGS. 10 and 11, components identical to those described with reference to FIGS. 4 and 9 are designated by like reference numerals, and their overlapping descriptions will be omitted. In addition, display devices shown in FIGS. 10 and 11 may be configured similar to the display device shown in FIG. 9, except configurations of inorganic material infiltration layers IFL, IFL1, and IFL2 and a surface reinforcing layer, which are included in touch sensors TS4 and TS5.

Referring to FIGS. 10 and 11, each display device DD may include a display element layer DL, an encapsulation layer TFE, and a touch sensor TS4 or TS5. The display device DD may further include an anti-reflection layer RPL and a window panel WP.

In an embodiment, as shown in FIG. 10, the touch sensor TS4 may include an inorganic material infiltration layer IFL provided on a second organic insulating layer OIL2. The inorganic material infiltration layer IFL may be provided on the second organic insulating layer OIL2 through an Atomic Layer Deposition (ALD) process.

The inorganic material infiltration layer IFL has a film density higher than that of the second organic insulating layer OIL2. Thus, increased bending characteristics are maintained, and gas out-gassed from underneath the inorganic material infiltration layer IFL may be blocked from passing through the window panel WP.

In an embodiment, as shown in FIG. 11, the touch sensor TS5 may include a plurality of inorganic material infiltration layers IFL1 and IFL2. A first inorganic material infiltration layer IFL1 may be provided on a first organic insulating layer OIL1 through the ALD process. A second inorganic material infiltration layer IFL2 may be provided on the second organic insulating layer OIL2 through the ALD process.

As described above, the first and second inorganic material infiltration layers IFL1 and IFL2 are formed, which have a density higher than that of the first organic insulating layer OIL1 and the second organic insulating layer OIL2, and are thinner than the first organic insulating layer OIL1 and the second organic insulating layer OIL2. Thus, increased bending characteristics are maintained, and the snowflake bubble defect is removed, and surface encapsulation characteristics can be further increased.

Figure 12:
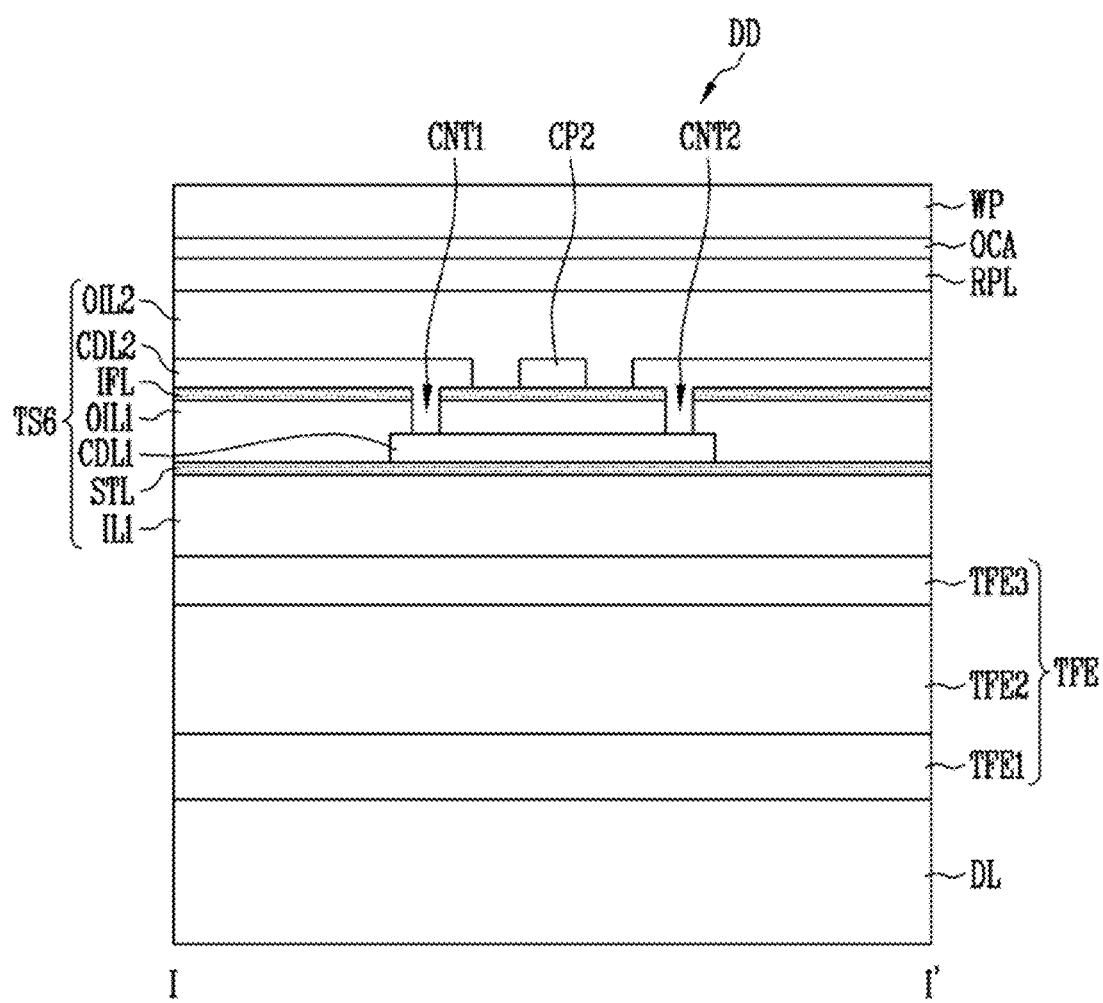
FIGS. 12 and 13 are cross-sectional views schematically illustrating examples of the display device including the portion I-I' of the touch sensor shown in FIG. 3.
Figure 13:
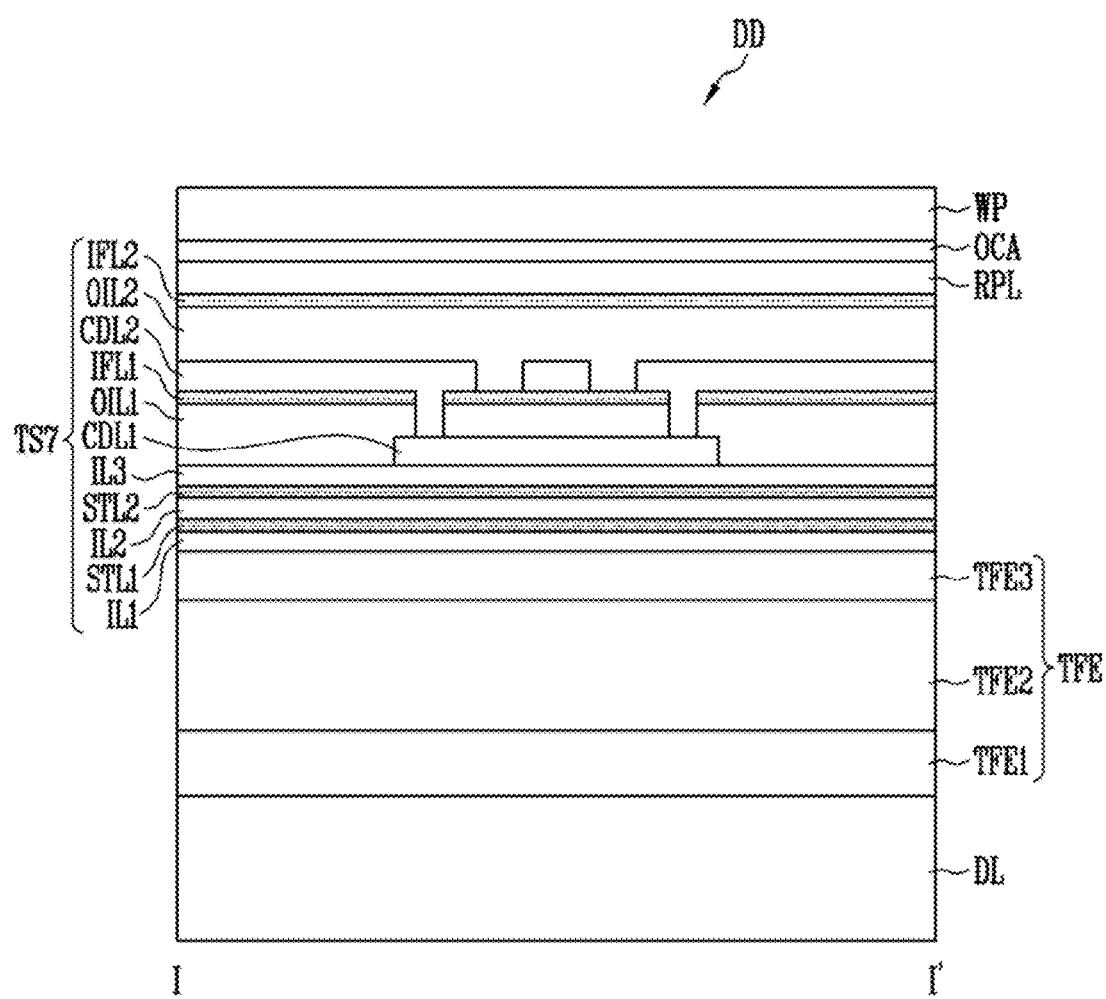

FIGS. 12 and 13 are cross-sectional views schematically illustrating examples of the display device including the portion I-I' of the touch sensor shown in FIG. 3.

In FIGS. 12 and 13, components identical to those described with reference to FIGS. 4 to 10 are designated by like reference numerals, and their overlapping descriptions will be omitted. The embodiments described with reference to FIGS. 12 and 13 may include both inorganic material infiltration layers and surface reinforcing layers.

Referring to FIGS. 12 and 13, each display device DD may include a display element layer DL, an encapsulation layer TFE, and a touch sensor TS6 or TS7. The display device DD may further include an anti-reflection layer RPL and a window panel WP.

As shown in FIG. 12, in an embodiment, the touch sensor TS6 may include a surface reinforcing layer STL provided on an inorganic insulating layer IL1 and an inorganic material infiltration layer IFL provided on a first organic insulating layer OIL1.

As shown in FIG. 13, in an embodiment, the touch sensor TS7 may include a plurality of surface reinforcing layers STL1 and STL2 respectively provided between inorganic insulating layers IL1, IL2, and IL3 and a plurality of inorganic material infiltration layers IFL1 and IFL2 respectively provided on surfaces of organic insulating layers OIL1 and OIL2.

The surface reinforcing layers STL1 and STL2 and the inorganic material infiltration layers IFL1 and IFL2 have been described above with reference to FIGS. 4 to 11, and therefore, overlapping descriptions will be omitted.

As described above, the touch sensor TS7 including the organic insulating layers OIL1 and OIL2 includes the surface reinforcing layers STL1 and STL2 and the inorganic material infiltration layers IFL1 and IFL2, so the snowflake bubble defect is removed and surface encapsulation characteristics can be further increased.

FIGS. 14A to 14G are cross-sectional views illustrating a method for manufacturing a display device in accordance with embodiments of the present disclosure.

In FIGS. 14A to 14G, components identical to those described with reference to FIGS. 4 to 13 are designated by like reference numerals, and their overlapping descriptions will be omitted.

Referring to FIGS. 14A to 14G, the method for manufacturing the display device may include depositing a first inorganic insulating layer IL1 on an encapsulation layer TFE covering a display element layer DL, forming a first surface reinforcing layer STL1 by performing surface treatment on the first inorganic insulating layer IL1, forming a first conductive layer CDL1 on the first surface reinforcing layer STL1, forming, on the first surface reinforcing layer STL1, a first organic insulating layer OIL1 including contact holes CNT1 and CNT2 which expose a portion of the first conductive layer CDL1, and forming, on the first organic insulating layer OIL1, a second conductive layer CDL2 connected to the first conductive layer CDL1 through the contact holes CNT1 and CNT2.

Figure 14A:
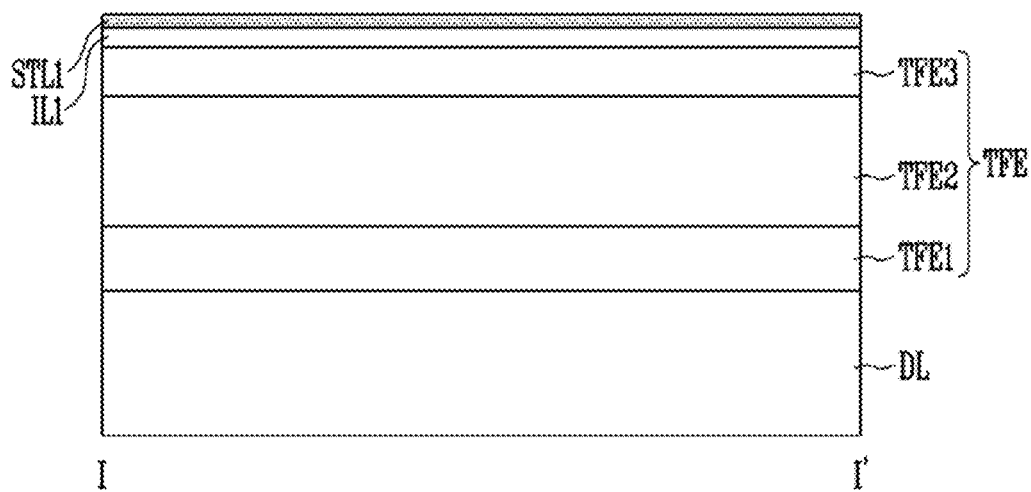
FIGS. 14A to 14G are cross-sectional views illustrating a method for manufacturing a display device in accordance with embodiments of the present disclosure.

As shown in FIG. 14A, the first inorganic insulating layer IL1 may be deposited on the encapsulation layer TFE, and the first surface reinforcing layer STL1 may be formed by performing surface treatment on the first inorganic insulating layer IL1. The first inorganic insulating layer IL1 may be formed through various forms of Chemical Vapor Deposition (CVD) processes.

In an embodiment, the first surface reinforcing layer STL1 may be formed by performing hydrogen plasma treatment on a surface of the first inorganic insulating layer IL1 for a predetermined time. The hydrogen plasma treatment may be performed so that the film density of a top surface of the first inorganic insulating layer IL1 can be increased. The film density of the first surface reinforcing layer STL1 may be higher than that of the first inorganic insulating layer IL1.

Figure 14B:
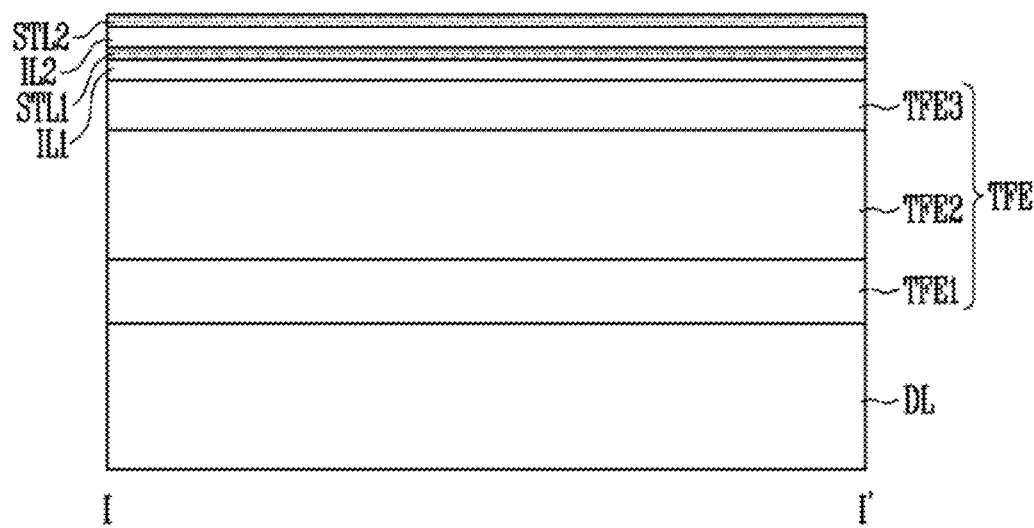

In an embodiment, as shown in FIG. 14B, a second inorganic insulating layer IL2 may be deposited on the first surface reinforcing layer STL1, and a second surface reinforcing layer STL2 may be formed by performing surface treatment on the second inorganic insulating layer IL2. In an embodiment, the second surface reinforcing layer STL2 may be formed by performing hydrogen plasma treatment on a surface of the second inorganic insulating layer IL2.

Figure 14C:
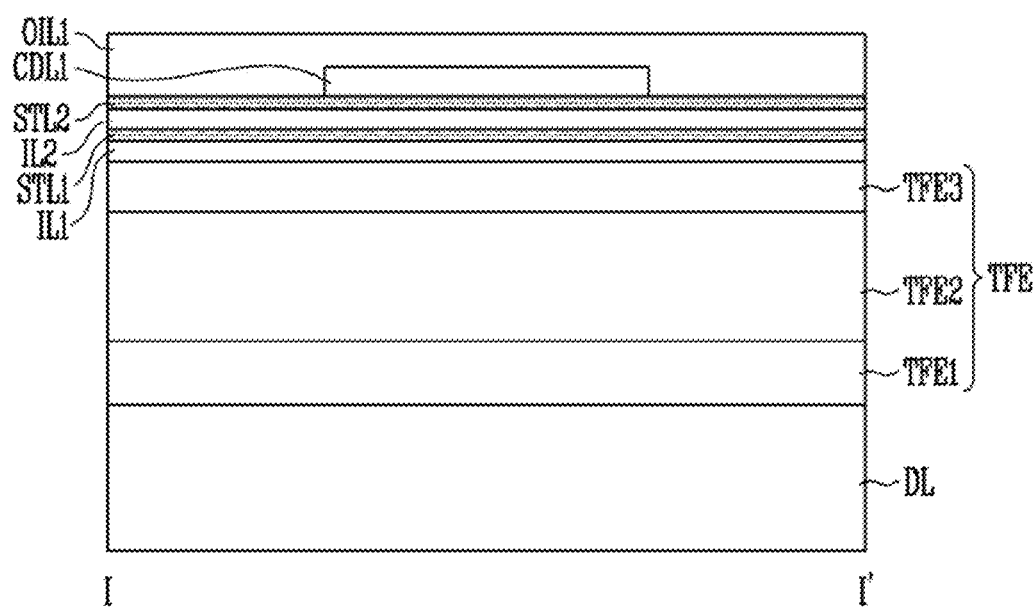

In an embodiment, as shown in FIG. 14C, after the first conductive layer CDL1 is formed on the second surface reinforcing layer STL2, the first organic insulating layer OIL1 covering the first conductive layer CDL1 may be formed on the second surface reinforcing layer STL2.

After a conductive material is deposited on the second surface reinforcing layer STL2, the first conductive layer CDL1 may be formed by patterning the deposited conductive material.

The first organic insulating layer OIL1 may be formed on the first conductive layer CDL1 and the second surface reinforcing layer STL2 through an organic material deposition process.

In FIG. 14C, it is illustrated that the first conductive layer CDL1 and the first organic insulating layer OIL1 covering the same are formed on the second surface reinforcing layer STL2, but the present disclosure is not necessarily limited thereto. For example, as shown in FIG. 8, a third inorganic insulating layer IL3 may be formed on the second surface reinforcing layer STL2, and the first conductive layer CDL1 and the first organic insulating layer OIL1 covering the same may be formed on the third inorganic insulating layer IL3.

Figure 14D:
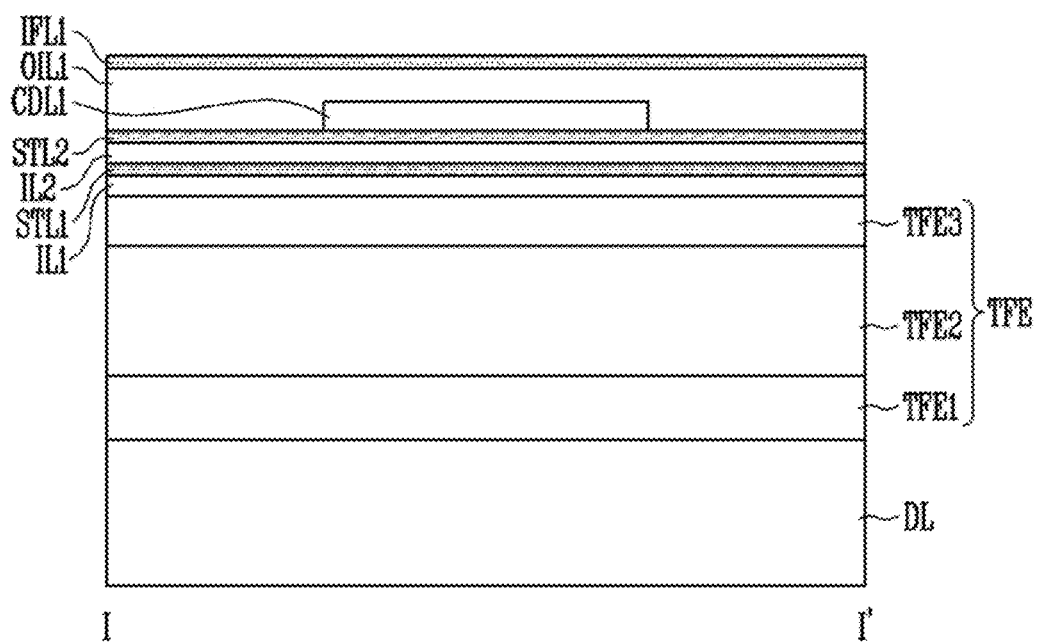

In an embodiment, as shown in FIG. 14D, a first inorganic material infiltration layer IFL1 may be formed on the first organic insulating layer OIL1 by infiltrating an inorganic material into a free volume near a surface of the first organic insulating layer OIL1 through an Atomic Layer Deposition (ALD) process.

In an embodiment, the process of forming the first inorganic material infiltration layer IFL1 may include infiltrating a source gas into the first organic insulating layer OIL1 by injecting the source gas onto the first organic insulating layer OIL1, and removing a portion of the source gas remaining on the first organic insulating layer OIL1 by injecting a purge gas. The source gas may include a precursor in which at least one of aluminum (Al), hafnium (Hf), titanium (Ti), zirconium (Zr), tantalum (Ta), and silicon (Si) and another subsidiary material are combined. The purge gas may include a material having a low reactivity. For example, the purge gas may include argon gas or an inert gas.

The precursor and a reactant of a reaction gas may be combined by injecting the reaction gas onto the first organic insulating layer OIL1. Accordingly, the first inorganic material infiltration layer IFL1 may be formed. The reactant may include oxygen radical, etc. The inorganic material formed in the first inorganic material infiltration layer IFL1 may be at least one selected from the group consisting of aluminum oxide, hafnium oxide, titanium oxide, zirconium oxide, tantalum oxide, and silicon oxide.

The purge gas may be injected onto the first organic insulating layer OIL1, to remove the source gas and the reaction gas.

As described above, the first inorganic material infiltration layer IFL1 has a structure in which an inorganic compound is filled in a partial free volume of the first organic insulating layer through the ALD process. Therefore, the first inorganic material infiltration layer IFL1 may have a film density higher than that of the first organic insulating layer OIL1.

Figure 14E:
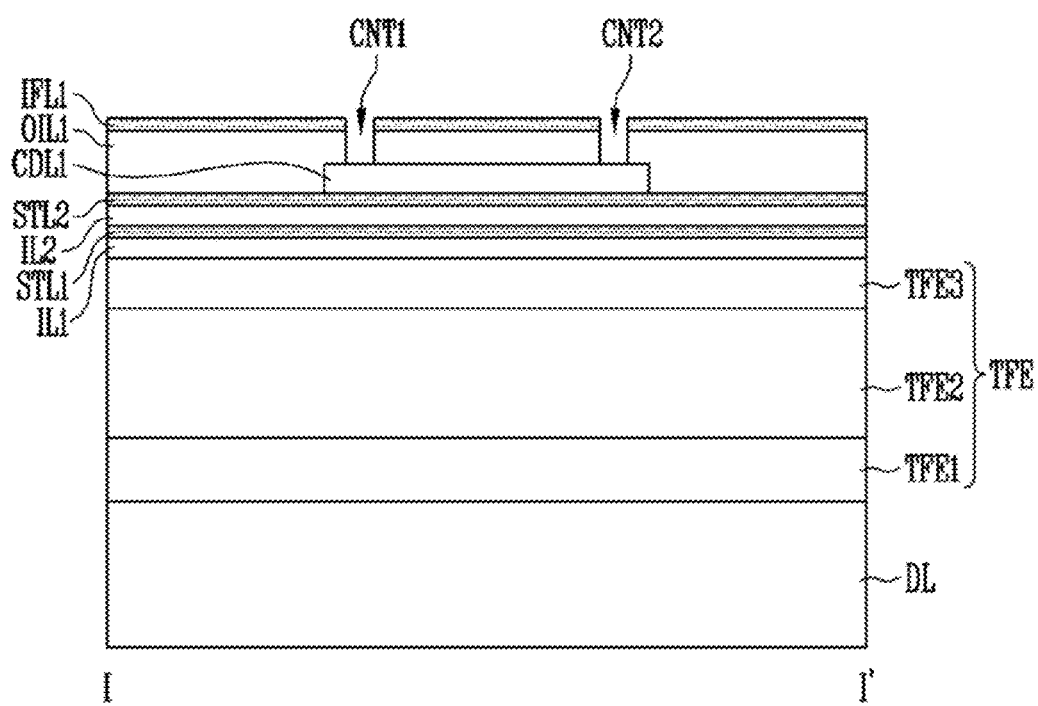

In an embodiment, as shown in FIG. 14E, the contact holes CNT1 and CNT2 may be formed by etching the first organic insulating layer OIL1 and the first inorganic material infiltration layer IFL1. The contact holes CNT1 and CNT2 may be formed through a process selected from various patterning processes, dry etching processes, and wet etching processes, which are known in the art.

Figure 14F:
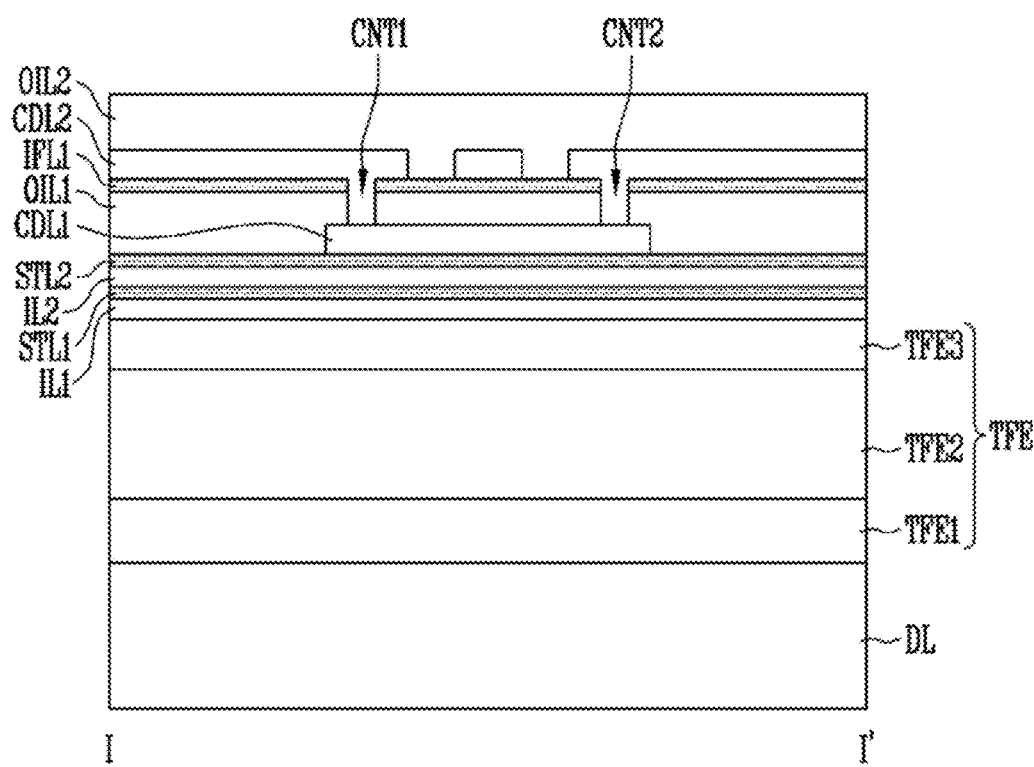

In an embodiment, as shown in FIG. 14F, the second conductive layer CDL2 connected to the first conductive layer CDL1 through the contact holes CNT1 and CNT2 may be formed on the first inorganic material infiltration layer IFL1. After a conductive material is deposited on the first inorganic material infiltration layer IFL1, the second conductive layer CDL2 may be formed by patterning the deposited conductive material.

In addition, a second organic insulating layer OIL2 may be formed on the first inorganic material infiltration layer IFL1 and cover the second conductive layer CDL2. The second organic insulating layer OIL2 may be formed on the second conductive layer CDL2 and the first inorganic material infiltration layer IFL1 through an organic material deposition process.

Figure 14G:
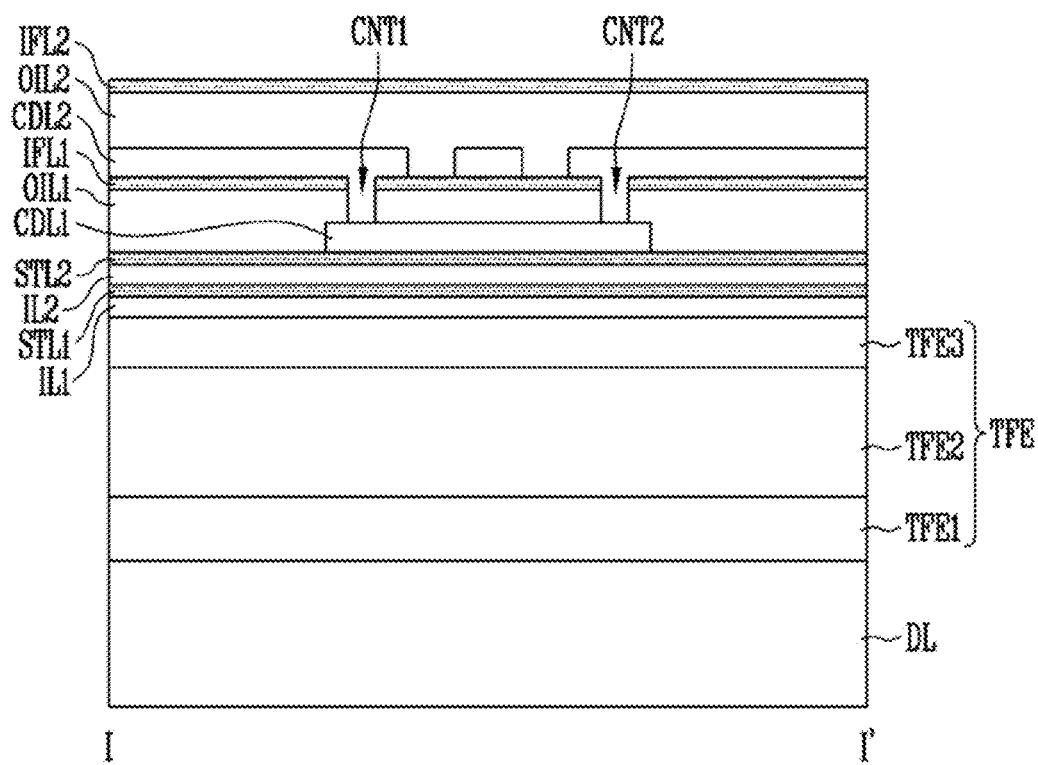

In an embodiment, as shown in FIG. 14G, a second inorganic material infiltration layer IFL2 may be formed by infiltrating an inorganic material into free volume near a surface of the second organic insulating layer OIL2 through the ALD process. Accordingly, film densities of the first inorganic material infiltration layer IFL1 the second inorganic material infiltration layer IFL2 may be higher than those of the first organic insulating layer OIL1 and the second organic insulating layer OIL2. As the film densities of both the first inorganic material infiltration layers IFL1 and IFL2 are relatively high, the increased bending characteristics of the display device may be maintained, and gases may be prevented from reaching the (not yet formed) window panel WP.

Subsequently, the anti-reflection layer RPL, the window panel WP, and the like, which are described in FIG. 4 and the like, may be sequentially further formed on the second inorganic material infiltration layer IFL2.

The touch sensors described with reference to FIGS. 4 to 12 may be formed through processes similar to those described above.

Meanwhile, a function of each component, a material included therein, and the like have been described in detail with reference to FIGS. 4 to 13, and therefore, overlapping descriptions will be omitted.

As described above, in the display device and the method for manufacturing the same in accordance with the embodiments of the present disclosure, a surface reinforcing layer and/or an inorganic material infiltration layer are included in an insulating layer of the touch sensor. The surface reinforcing layer and/or the inorganic material infiltration layer may block passage of gas (bubbles) transferred from inorganic layers beneath them, and may be resilient to temperature change, moisture permeability, oxidation, etc. Accordingly, a snowflake bubble defect of the display device and the touch sensor may be removed, bending capability may be increased, and surface encapsulation characteristics may be reinforced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a display element layer disposed on a substrate, wherein the display element layer includes pixels;
an encapsulation layer covering the display element layer; and
a touch sensor disposed on the encapsulation layer,
wherein the touch sensor comprises:
a first inorganic insulating layer disposed on the encapsulation layer;
a first surface reinforcing layer, wherein the first surface reinforcing layer is formed by performing surface treatment on the first inorganic insulating layer;
a first conductive layer disposed on the first surface reinforcing layer;
a first organic insulating layer disposed on and directly contacting a portion of an uppermost surface and a side surface of an end of the first conductive layer, wherein the first conductive layer is disposed between the first surface reinforcing layer and the first organic insulating layer; and
a second conductive layer disposed on the first organic insulating layer, wherein the second conductive layer is disposed on the first conductive layer and penetrates the first organic insulating layer.

2. The display device of claim 1, wherein the first surface reinforcing layer has a thickness within a range of 10 Å to 500 Å.

3. The display device of claim 1, wherein the first surface reinforcing layer is obtained by performing hydrogen plasma treatment on a surface of the first inorganic insulating layer, and
wherein the first surface reinforcing layer has a film density greater than that of the first inorganic insulating layer.

4. The display device of claim 3, wherein the touch sensor further comprises a second inorganic insulating layer disposed between the first surface reinforcing layer and the first conductive layer.

5. The display device of claim 4, wherein the touch sensor further comprises:
a second surface reinforcing layer disposed on the second inorganic insulating layer, wherein the second surface reinforcing layer is formed by performing hydrogen plasma treatment on a surface of the second inorganic insulating layer; and
a third inorganic insulating layer disposed between the second surface reinforcing layer and the first conductive layer.

6. The display device of claim 1, wherein the touch sensor further comprises:
a first inorganic material infiltration layer disposed on a surface of the first organic insulating layer, wherein the first inorganic material infiltration layer includes an organic material from the surface of the first organic insulating layer and further includes an inorganic material infiltrated into a free volume of the surface of the first organic insulating layer; and
a second organic insulating layer disposed on the first inorganic material infiltration layer, and covering the second conductive layer.

7. The display device of claim 6, wherein the touch sensor further comprises a second inorganic material infiltration layer disposed on a surface of the second organic insulating layer, wherein the second inorganic material infiltration layer includes an organic material from the surface of the second organic insulating layer and further includes an inorganic material infiltrated into a free volume of the surface of the second organic insulating layer, and
wherein film densities of the first inorganic material infiltration layer and the second inorganic material infiltration layer are greater than those of the first organic insulating layer and the second organic insulating layer.

8. The display device of claim 7, wherein the inorganic material includes one or more of aluminum oxide, hafnium oxide, titanium oxide, zirconium oxide, tantalum oxide, silicon oxide, silicon nitride, and silicon oxynitride.

9. The display device of claim 1, wherein the touch sensor further comprises:
a second organic insulating layer disposed on the first organic insulating layer and covering the second conductive layer; and
an inorganic material infiltration layer disposed on a surface of the second organic insulating layer, wherein the inorganic material infiltration layer includes an organic material from the surface of the second organic insulating layer and further includes an inorganic material infiltrated into a free volume of the surface of the second organic insulating layer.

10. The display device of claim 1, wherein the encapsulation layer comprises:
at least one encapsulation organic layer; and
encapsulation inorganic layers disposed on both a top surface and a bottom surface of the at least one encapsulation organic layer.

11. A method for manufacturing a display device, the method comprising:
depositing a first inorganic insulating layer on an encapsulation layer, wherein the encapsulation layer covering a display element layer;
forming a first surface reinforcing layer by performing surface treatment on the first inorganic insulating layer;
forming a first conductive layer on the first surface reinforcing layer;
forming, on the first surface reinforcing layer, a first organic insulating layer including a contact hole exposing a portion of the first conductive layer;
forming, on the first organic insulating layer, a second conductive layer connected to the first conductive layer through the contact hole;
forming a first inorganic material infiltration layer by infiltrating an inorganic material into a free volume of the first organic insulating layer near a surface of the first organic insulating layer through an atomic layer deposition process;
infiltrating the inorganic material through a reaction of a source gas and a reaction gas, by injecting the reaction gas including oxygen radical onto the first organic insulating layer; and
injecting a purge gas to remove a remaining portion of the source gas and the reaction gas.

12. The method of claim 11, wherein, in the forming of the first surface reinforcing layer, hydrogen plasma treatment is performed on a surface of the first inorganic insulating layer for a predetermined time.

13. The method of claim 11, wherein the forming of the first surface reinforcing layer further comprises depositing a second inorganic insulating layer on the first surface reinforcing layer.

14. The method of claim 13, wherein the forming of the first surface reinforcing layer further comprises forming a second surface reinforcing layer by performing hydrogen plasma treatment on a surface of the second inorganic insulating layer.

15. The method of claim 11, wherein the forming of the first organic insulating layer comprises:
    depositing the first organic insulating layer on the first surface reinforcing layer; and
    forming the contact hole by etching the first organic insulating layer and the first inorganic material infiltration layer.

16. The method of claim 15, wherein the forming of the first inorganic material infiltration layer comprises:
    infiltrating the source gas into the first organic insulating layer by injecting the source gas onto the first organic insulating layer; and
    injecting the purge gas to remove a portion of the source gas remaining on the first organic insulating layer.

17. The method of claim 16, wherein the inorganic material includes one or more of aluminum oxide, hafnium oxide, titanium oxide, zirconium oxide, tantalum oxide, and silicon oxide.

18. The method of claim 15, further comprising:
    forming a second organic insulating layer on the first inorganic material infiltration layer, wherein the second organic insulating layer covers the second conductive layer; and
    forming a second inorganic material infiltration layer by infiltrating the inorganic material into a free volume of the second organic insulating layer near a surface of the second organic insulating layer through the atomic layer deposition process.

19. The method of claim 18, wherein film densities of the first inorganic material infiltration layer and the second inorganic material infiltration layer are greater than those of the first organic insulating layer and the second organic insulating layer.

20. A display device comprising:
    a display element layer disposed on a substrate, the display element layer including pixels;
    an encapsulation layer covering the display element layer;
    a touch sensor disposed on the encapsulation layer; and
    a window disposed on the touch sensor,
    wherein the touch sensor comprises:
    an inorganic insulating layer disposed on the encapsulation layer;
    a first conductive layer disposed on a first surface reinforcing layer, wherein the first surface reinforcing layer is disposed on the inorganic insulating layer;
    a first organic insulating layer covering the first conductive layer, wherein the first conductive layer is disposed between the first surface reinforcing layer and the first organic insulating layer;
    an inorganic material infiltration layer disposed on a surface of the first organic insulating layer, wherein the inorganic material infiltration layer includes an organic material from the surface of the first organic insulating layer and further includes an inorganic material infiltrated into a free volume of the first organic insulating layer near the surface of the first organic insulating layer;
    a second conductive layer disposed on the inorganic material infiltration layer and connected to the first conductive layer, wherein the second conductive layer penetrates the first organic insulating layer and the inorganic material infiltration layer; and
    a second organic insulating layer disposed on the inorganic material infiltration layer to cover the second conductive layer,
    wherein the inorganic material infiltration layer has a film density greater than that of the first organic insulating layer.

* * * * *